(12) United States Patent
Lynch et al.

(10) Patent No.: US 7,808,844 B2
(45) Date of Patent: *Oct. 5, 2010

(54) METHODS AND APPARATUS FOR IMPROVED MEMORY ACCESS

(75) Inventors: William Thomas Lynch, Apex, NC (US); David James Herbison, Arvada, CO (US)

(73) Assignee: Ring Technology Enterprises os Texas, LLC, Tyler, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/806,012

(22) Filed: May 29, 2007

(65) Prior Publication Data

US 2007/0237009 A1     Oct. 11, 2007

Related U.S. Application Data

(63) Continuation of application No. 11/030,881, filed on Jan. 10, 2005, now Pat. No. 7,313,035, which is a continuation of application No. 10/284,198, filed on Oct. 31, 2002, now Pat. No. 6,879,526.

(51) Int. Cl.
*G11C 7/00* (2006.01)

(52) U.S. Cl. ............................ 365/189.12; 365/185.11; 365/233.1

(58) Field of Classification Search ............ 365/189.12, 365/189.11, 233.1
See application file for complete search history.

(56) References Cited

U.S. PATENT DOCUMENTS

| | | |
|---|---|---|
| 3,713,096 A | 1/1973 | Comfort et al. |
| 3,735,362 A | 5/1973 | Ashany et al. |
| 3,748,647 A | 7/1973 | Ashany et al. |
| 3,812,476 A | 5/1974 | Cragon |
| 4,064,556 A | 12/1977 | Edelberg et al. |
| 4,065,756 A | 12/1977 | Panigrahi |
| 4,193,121 A | 3/1980 | Fedida et al. |

(Continued)

FOREIGN PATENT DOCUMENTS

WO    WO 97/07458    2/1997

(Continued)

OTHER PUBLICATIONS

International Search Report dated May 27, 2004, for International Application No. PCT/US03/33679 (3 pages).

(Continued)

*Primary Examiner*—Huan Hoang
(74) *Attorney, Agent, or Firm*—Andrews Kurth LLP

(57) ABSTRACT

A memory access scheme employing one or more sets of shift registers interconnected in series to which data may be loaded from or written into one or more memory devices. That is, data from the memory devices may be parallel loaded into the sets of shift registers and then serially shifted through the shift registers until it is output from the sets of shift registers and transferred to its destination. Additionally, the data may be read from and loaded into the memory devices to/from the sets of shift registers such that the shifting of the shift registers is uninterrupted during the reading and/or loading of data. Additionally, data from the memory devices may be loaded into two or more parallel chains of shift registers and then serially shifted through the shift register chains.

10 Claims, 16 Drawing Sheets

U.S. PATENT DOCUMENTS

| | | | |
|---|---|---|---|
| 4,302,632 A | 11/1981 | Vicari et al. | |
| 4,334,305 A | 6/1982 | Girardi | |
| 4,363,125 A | 12/1982 | Brewer et al. | |
| 4,506,387 A | 3/1985 | Walter | |
| 4,510,599 A | 4/1985 | Ulug | |
| 4,538,174 A | 8/1985 | Gargini et al. | |
| 4,646,270 A | 2/1987 | Voss | |
| 4,672,602 A | 6/1987 | Hargrave et al. | |
| 4,709,418 A | 11/1987 | Fox et al. | |
| 4,763,317 A | 8/1988 | Lehman et al. | |
| 4,790,418 A | 12/1988 | Brown et al. | |
| 4,796,231 A | 1/1989 | Pinkham | |
| 4,980,857 A | 12/1990 | Walter et al. | |
| 4,984,240 A | 1/1991 | Keren-Zvi et al. | |
| 4,995,078 A | 2/1991 | Monslow et al. | |
| 5,003,591 A | 3/1991 | Kauffman et al. | |
| 5,014,125 A | 5/1991 | Pocock et al. | |
| 5,027,400 A | 6/1991 | Baji et al. | |
| 5,060,068 A | 10/1991 | Lindstrom | |
| 5,062,059 A | 10/1991 | Youngblood et al. | |
| 5,084,839 A | 1/1992 | Young | |
| 5,119,481 A | 6/1992 | Frank et al. | |
| 5,130,792 A | 7/1992 | Tindell et al. | |
| 5,132,992 A | 7/1992 | Yurt et al. | |
| 5,133,079 A | 7/1992 | Ballantyne et al. | |
| 5,153,884 A | 10/1992 | Lucak et al. | |
| 5,163,024 A | 11/1992 | Heilveil et al. | |
| 5,191,410 A | 3/1993 | McCalley et al. | |
| 5,200,925 A | 4/1993 | Moruoka et al. | |
| 5,247,347 A | 9/1993 | Litteral et al. | |
| 5,253,341 A | 10/1993 | Rozmanith et al. | |
| 5,261,114 A | 11/1993 | Raasch et al. | |
| 5,285,451 A | 2/1994 | Henson et al. | |
| 5,369,784 A | 11/1994 | Nelson et al. | |
| 5,371,532 A | 12/1994 | Gelman et al. | |
| 5,374,952 A | 12/1994 | Flohr | |
| 5,400,331 A | 3/1995 | Lucak et al. | |
| 5,553,311 A | 9/1996 | McLaughlin et al. | |
| 5,581,479 A | 12/1996 | McLaughlin et al. | |
| 5,604,682 A | 2/1997 | McLaughlin et al. | |
| 5,636,139 A | 6/1997 | McLaughlin et al. | |
| 5,729,763 A | 3/1998 | Leshem | |
| 5,768,623 A | 6/1998 | Judd et al. | |
| 5,771,367 A | 6/1998 | Beardsey et al. | |
| 5,883,831 A | 3/1999 | Lopez et al. | |
| 5,908,333 A | 6/1999 | Perino et al. | |
| 5,909,564 A | 6/1999 | Alexander et al. | |
| 5,953,263 A | 9/1999 | Farmwald et al. | |
| 5,954,804 A | 9/1999 | Farmwald et al. | |
| 5,968,114 A | 10/1999 | Wentka et al. | |
| 5,978,295 A | 11/1999 | Pomet et al. | |
| 6,032,214 A | 2/2000 | Farmwald et al. | |
| 6,034,918 A | 3/2000 | Farmwald et al. | |
| 6,185,644 B1 | 2/2001 | Farmwald et al. | |
| 6,198,649 B1 * | 3/2001 | Matsudera et al. | 365/63 |
| 6,317,377 B1 | 11/2001 | Kobayashi | |
| 6,356,973 B1 | 3/2002 | McLaughlin et al. | |
| 6,356,975 B1 | 3/2002 | Barth et al. | |
| 6,498,741 B2 | 12/2002 | Matsudera et al. | |
| 6,560,146 B2 * | 5/2003 | Cernea | 365/189.05 |
| 6,587,909 B1 | 7/2003 | Olarig et al. | |
| 6,684,292 B2 | 1/2004 | Piccirillo et al. | |
| 6,697,368 B2 | 2/2004 | Chang et al. | |
| 6,728,799 B1 | 4/2004 | Perner et al. | |
| 6,879,526 B2 | 4/2005 | Lynch et al. | |
| 6,981,173 B2 | 12/2005 | Ferguson et al. | |
| 7,069,468 B1 | 6/2006 | Olson et al. | |
| 7,197,662 B2 | 3/2007 | Bullen et al. | |
| 7,266,706 B2 | 9/2007 | Brown et al. | |
| 7,313,035 B2 | 12/2007 | Lynch et al. | |
| 7,415,565 B2 | 8/2008 | Bullen et al. | |
| 7,543,177 B2 | 6/2009 | Bullen et al. | |
| 2002/0040450 A1 | 4/2002 | Harris et al. | |
| 2002/0087751 A1 | 7/2002 | Chong | |
| 2003/0018930 A1 | 1/2003 | Mora et al. | |
| 2003/0135782 A1 | 7/2003 | Matsunami et al. | |
| 2003/0187945 A1 | 10/2003 | Lubbers et al. | |
| 2004/0044744 A1 | 3/2004 | Grosner et al. | |
| 2004/0068561 A1 | 4/2004 | Yamamoto et al. | |
| 2004/0085818 A1 | 5/2004 | Lynch et al. | |
| 2004/0088477 A1 | 5/2004 | Bullen et al. | |
| 2004/0088514 A1 | 5/2004 | Bullen et al. | |
| 2004/0168101 A1 | 8/2004 | Kubo | |
| 2005/0025321 A1 | 2/2005 | Alamian | |
| 2008/0052454 A1 | 2/2008 | Bullen et al. | |

FOREIGN PATENT DOCUMENTS

| | | |
|---|---|---|
| WO | WO 2004/025476 A1 | 3/2004 |
| WO | WO2004/042505 | 5/2004 |
| WO | WO2004/042506 | 5/2004 |

OTHER PUBLICATIONS

International Search Report dated Jan. 14, 2005 for International Application No. PCT/US03/33665.
Office Action for U.S. Appl. No. 10/284,268 dated Apr. 24, 2006 (16 pages).
Office Action for U.S. Appl. No. 10/284,199 dated Jun. 15, 2006, (12 pages).
Office Action for Application No. 10/284,278 dated Apr. 24, 2006, (12 pages).
Prince, Betty, "High Performance Memories New Architecture DRAMs and SRAMs—Evolution and Function Revised Edition," John Wiley & Sons, Ltd., 1996, entire book.
RDRAM® Memory: Leading performance and Value Over SDRAM and DDR, Document WP0001-R, Version 1.2, 2001.
RDRAM®: Maximizing the Value of PCs and Workstations, Document WP00-3-R, Version 1.0, 2001.
The Economist, Jun. 22, 2002, $28^{th}$ edition, A Match for Flash?, pp. 22-23.
Office Action for U.S. Appl. No. 10/284,278 dated Mar. 18, 2005, (12 pages).
Office Action for U.S. Appl. No. 10/284,278 dated Sep. 26, 2005, (13 pages).
Office Action for U.S. Appl. No. 10/284,268 dated Mar. 18, 2005, (14 pages).
Office Action for U.S. Appl. No. 10/284,268 dated Sep. 21, 2005, (13 pages).
Malavalli, Kumar, "Fibre Channel Classes of Service for Data Transport," Brocade Communications Services, Inc. 1997, 15 pages.
"HyperTransport™ I/O Link Specification," HyperTransport Technology Consortium, Rev. 1.03, Oct. 10, 2001, 217 pages.
Tran, Jennifer, "Synthesizable 1.6 Gbytes/s DDR SRAM Controller" Xilinx Application Note XAPP200, Mar. 21, 2000, 12 pages.
"Using Block SelectRam+ Memory in Spartan-II FPGAs," Xilinx Application Note XAPP173, Dec. 11, 2000, 15 pages.
"200-MHz SDRAM Controller Core Product Specification" Alliance Core, Jan. 10, 2000, 4 pages.
Bapat, Sheker, "Synthesizable 200 MHz ZBT SRAM Interface" Xilinx Application Note XAPP136, Jan. 10, 2000, 6 pages.
"Synthesizable High Performance SDRAM Controller" Xilinx application Note XAPP134, Feb. 1, 2001, 16 pages.
Ma, Alex, "Synchronous DRAM Controller" Powerpoint slides, EE527 Spring 1998, 21 pages.
"170 MHz FIFOs Using the Virtex Block SelectRAM+ Features" Xilinx Application Note XAPP131, Jun. 5, 2001, 6 pages.
"Using the Virtex Block SelectRAM+ Features" Xilinx Application Note XAPP130, Dec. 18, 2000, 11 pages.
"API Networks, enabling technology for next generation product . . . HyperTransport Technology Licensed by HP" (Retrieved Mar. 18, 2002)< http://www.qpi-networks.com/pressreleases/pr121001.shtml>, API Networks, Dec. 10, 2001, 2 pages.
Richmond, Robert, "AMD 64-Bit K8 Platform Preview" (retrieved Mar. 11, 2002) Sep. 14, 2000, 4 pages.

"InfiniBridge MT21108 Infiniband Channel Adapter and Eight Port Switch" Product Specification, Mellanox Technologies, (date unknown) 4 pages.
"Block SelectRAM Overview" (retrieved Mar. 18, 2002) <http://www.xilinx.com/xil_podcat_systemsolution.jsp?title=xam_memory_embedded_blockram_pag>, 2 pages.
McComas, Bert "PCI-X or InfiniBand Complementary New Technologies Go Head to Head" (retrieved Mar. 18, 2002) <http://www.inqst.com/articles/pcixvib/pciarticle.htm>, Inquest Market Research, Jan. 19, 2001, 10 pages.
"API Networks Accelerates Use of HyperTransport™ Technology With Launch of Industry's First HyperTransport-to-PCI Bridge Chip" API Networks Press Release, Apr. 2, 2001, 2 pages.
"HyperTransport-to-PCI Bridge Chip from API Networks" Cahners Business Information 2002, 1 page.
"API Networks Unveils Industry's First HyperTransport™ Switch to Bring Products to Market Quickly and Cost-Effectively" API Networks Press Release, Nov. 5, 2001, 4 pages.
"74F1763 Intelligent DRAM Controller Product Information" Philips Semiconductors 2002, 2 pages.
"Sections 5.4.1-5.4.5 of document describing DRAM and DRAM Controller" (author and date unknown).
"Basic DRAM Cell" (retrieved Mar. 17, 2002),< http://www/mit.edu:8001/people/tairan/6371/node59.html>, MIT, Jun. 26, 1996, 1 page.
"Row Address Decoder and Row Driver" (retrieved Mar. 17, 2002), <http://www.mit.edu:8001/people/tairan/6371/node60.html>, MIT, Jun. 26, 1996, 1 page.
"Column Decode and Refresh Control Logic" (retrieved Mar. 17, 2002), <http://www.mit.edu:8001/people/tairan/6371/node61.html>, MIT, Jun. 26, 1996, 1 page.
"Refresh Circuit" (retrieved Mar. 17, 2002), <hppt://www.mit.edu:8001/people/tairan/5371/node62.html>, MIT, Jun. 26, 1996, 1 page.
"Refresh Address Control" (retrieved Mar. 17, 2002), <http://www.mit/edu:8001/people/tairan/6371/node63.html>, MIT, Jun. 26, 1996, 1 page.
"Data-In Tristate Buffer" (retrieved Mar. 17, 2002), <http://www.mit.edu:8001/people/tairan/6371/node64.html>, MIT, Jun. 26, 1996, 1 page.
"Data-out Precharging Circuits and Control Circuits" (retrieved Mar. 17, 2002), <http://www.mit.edu:8001/people/tairan/6371/node65.html>, MIT, Jun. 26, 1996, 1 page.
"Output Multiplexer" (retrieved Mar. 17, 2002), < http://www.mit.edu:8001/people/tairan/6371/node66.html>, MIT, Jun. 26, 1996, 1 page.
"Other Circuits" (retrieved Mar. 17, 2002, <http://www.mit/edu:8001/people/tairan/6371/node67.html>, MIT, Jun. 26, 1996, 1 page.
"Simulations" (retrieved Mar. 17, 2002),< http://www.mit.edu:8001/people.tairan/6371/node68.html>, MIT, Jun. 26, 1996, 1 page.
"Comments" (retrieved Mar. 17, 2002), >http://www.mit/edu:8001/people/tairan/6371/node70.html>, MIT, Jun. 26, 1995, 1 page.
"HHSPICE Verification of Latch" (retrieved Mar. 17, 2002), <http://www.mit.edu:8001/people/tairan/6371/node73.html>, MIT, Jun. 26, 1996, 1 page.
"Introduction" (retrieved Mar. 17, 2002), <http://www4.tomshardware.com/mainboard/98q4/981024/index.html>, 2 pages.
"Basic DRAM Operation" (retrieved Mar. 17, 2002), <http://www4.tomshardware.com/mainboard/98q4/981024/ram-01.html>, 2 pages.
"Asynchronous Operation" (retrieved Mar. 17, 2002), <http://www4.tomshardware.com/mainboard/98q4/981024/ram-02.html>, 2 pages.
"Synchronous Operation" (retrieved Mar. 17, 2002), <http://www4.tomshardware.com/mainboard/98q4/981024/ram-07.html>, 2 pages.
"DDR SDRAM" (retrieved Mar. 17, 2002), <http://www4.tomshardware.com/mainboard/98q4/981024/ram-10.html>, 2 pages.
Farley, Marc, "Building Storage Networks, Second Edition," Osbourne/McGraw-Hill, 2001, entire book.
Clark, Tom, "Designing Storage Area Networks—A Practical Reference for Implementing Fibre Channel SANs," Addison-Wesley, 1999.
U.S. Appl. No. 10/284,268 including Specification, Claims and Figures.
U.S. Appl. No. 10/284,199 including Specification, Claims and Figures.
U.S. Appl. No. 10/284,278 including Specification, Claims and Figures.
Preston, W. Curtis, "Using SANs and NAS," O'Reilly & Associates, Inc., Feb. 2002.
Mauro, Douglas R., et al., "Essential SNMP," O'Reilly & Associates, Inc., Jul. 2001.
Communication Pursuant to Article 94(3) EPC for EPO Appl. No. 03 777 844.6 dated Feb. 11, 2008 (10 pages).
Communication Pursuant to Article 94(3) EPC for EPO Appl. No. 03 810 796.7 dated Apr. 25, 2008.
Office Action for U.S. Appl. No. 11/710,407 mailed Mar. 27, 2008 (9 pages).
Office Action for U.S. Appl. No. 10/284,268 mailed Dec. 31, 2007 (15 pages).
Supplemental European Search Report for European Appl. No. EP 03 77 7844 dated Oct. 12, 2007 (2 pages).
European Patent Office Action dated Mar. 27, 2007, for European Application No. 38 810 796.7 (4 pages).
Notices of Allowance and Allowability for U.S. Appl. No. 10/284,278 dated May 1, 2007 (6 pgs.) with Suppl. Amendment filed Jan. 25, 2007, listing allowed claims (14 pgs.).
Office Action for U.S. Appl. No. 10/284,268, dated Apr. 11, 2007 (5 pgs.).
Final Office Action for U.S. Appl. No. 11/710,407 mailed Oct. 23, 2008 (11 pages).
Notice of Allowance and Allowability for U.S. Appl. No. 10/284,268 mailed Jun. 24, 2008 (15 pages) and Amendment filed Jun. 10, 2008, listing allowed claims (16 pages).
Communication Pursuant to Article 94(3) EPC, dated Jan. 29, 2009, for European Application No. 03810796.7-2210 (3 pages).
Communication Under Rule 71(3) EPC, dated Oct. 28, 2008, for European Application No. 03 777 844.6-2224 (6 pages).
Notice of Allowance and Allowability, dated Jun. 28, 2007, for U.S. Appl. No. 11/030,881, and Reply, filed May 8, 2007, listing allowed claims (13 pages).
Notice of Allowance and Allowability, dated Mar. 23, 2009, for U.S. Appl. No. 11/710,407 (7 pages) with Reply filed Feb. 23, 2009, listing allowed claims (14 pages).
Office Action, dated Jul. 10, 2006, for U.S. Appl. No. 11/030,881 (5 pages).
Office Action, dated Jan. 11, 2006, for U.S. Appl. No. 11/030,881 (5 pages).
Office Action, dated Jul. 27, 2005, for U.S. Appl. No. 11/030,881 (8 pages).
Office Action, dated Feb. 28, 2007, for U.S. Appl. No. 11/030,881 (6 pages).
Extended European Search Report and Opinion, dated Apr. 8, 2009, for European Application No. EP 09 15 3548.4 (12 pages).

* cited by examiner

METHODS AND APPARATUS FOR IMPROVED MEMORY ACCESS

This is a continuation of and claims benefit of application Ser. No. 11/030,881, filed Jan. 10, 2005, now U.S. Pat. No. 7,313,035, which is a continuation of application Ser. No. 10/284,198, filed Oct. 31, 2002, (now U.S. Pat. No. 6,879,526), both of which are incorporated herein by reference.

BACKGROUND

The present invention relates to memory access, and more particularly, to methods and systems for improving access to memory devices.

Processors in today's PCs (and workstations, as well as cache, graphics subsystems, and high speed communications equipment, are demanding higher bandwidths and speeds from memory. Memory manufacturers have been responding by improving the access speeds for solid state memories. While memory manufacturers are making significant gains in both speed and bandwidth, there still remains a significant gap between the speed requirements of processors and the speed and bandwidths today's memories can provide.

SUMMARY

Accordingly, the present invention is directed to methods and systems that address the problems of prior art. In accordance with the purposes of the invention, as embodied and broadly described herein, methods and systems for an apparatus are provided having at least one memory device having one or more outputs, and at least one set of shift registers interconnected in series, wherein at least one of the shift registers receives a clock signal having a shift frequency, and wherein the shift register is capable of shifting data loaded into the shift register to a next one of the shift registers in the set according to the clock signal. In the apparatus, data from one or more of the outputs of the memory device may be loaded into a corresponding shift register in one of the sets of shift registers and the loaded data shifted from the shift register to a next one of the shift registers in the set according to the clock signal, such that the clock signal received by the shift register maintains its shift frequency during any loading of the data.

In another aspect, methods and systems for an apparatus are provided including at least one memory device having outputs, at least a first set of shift registers interconnected in series and a second set of shift registers interconnected in series, and a plurality of connectors each connecting one of the outputs of at least one of the memory devices to a corresponding shift register in the first or second set of shift registers. In the apparatus, data from at least one of the outputs of the memory devices may be loaded into the corresponding shift register in the first or second sets of shift registers via the plurality of connectors, and the data loaded into the first set of shift registers shifted from one of the shift registers in the first set of shift registers to a next one of the shift registers in the first set of shift registers according to a clock signal. Additionally, in the apparatus the data loaded into the second set of shift registers may be shifted from one of the shift registers in the second set of shift registers to a next one of the shift registers in the second set of shift registers according to the clock signal.

The summary and the following detailed description should not restrict the scope of the claimed invention. Both provide examples and explanations to enable others to practice the invention. The accompanying drawings, which form part of the description for carrying out the best mode of the invention, show several embodiments of the invention, and together with the description, explain the principles of the invention.

DETAILED DESCRIPTION

Reference will now be made in detail to embodiments of the invention, examples of which are illustrated in the accompanying drawings. Wherever possible, the same reference numbers will be used throughout the drawings to refer to the same or like parts.

Figure 1:
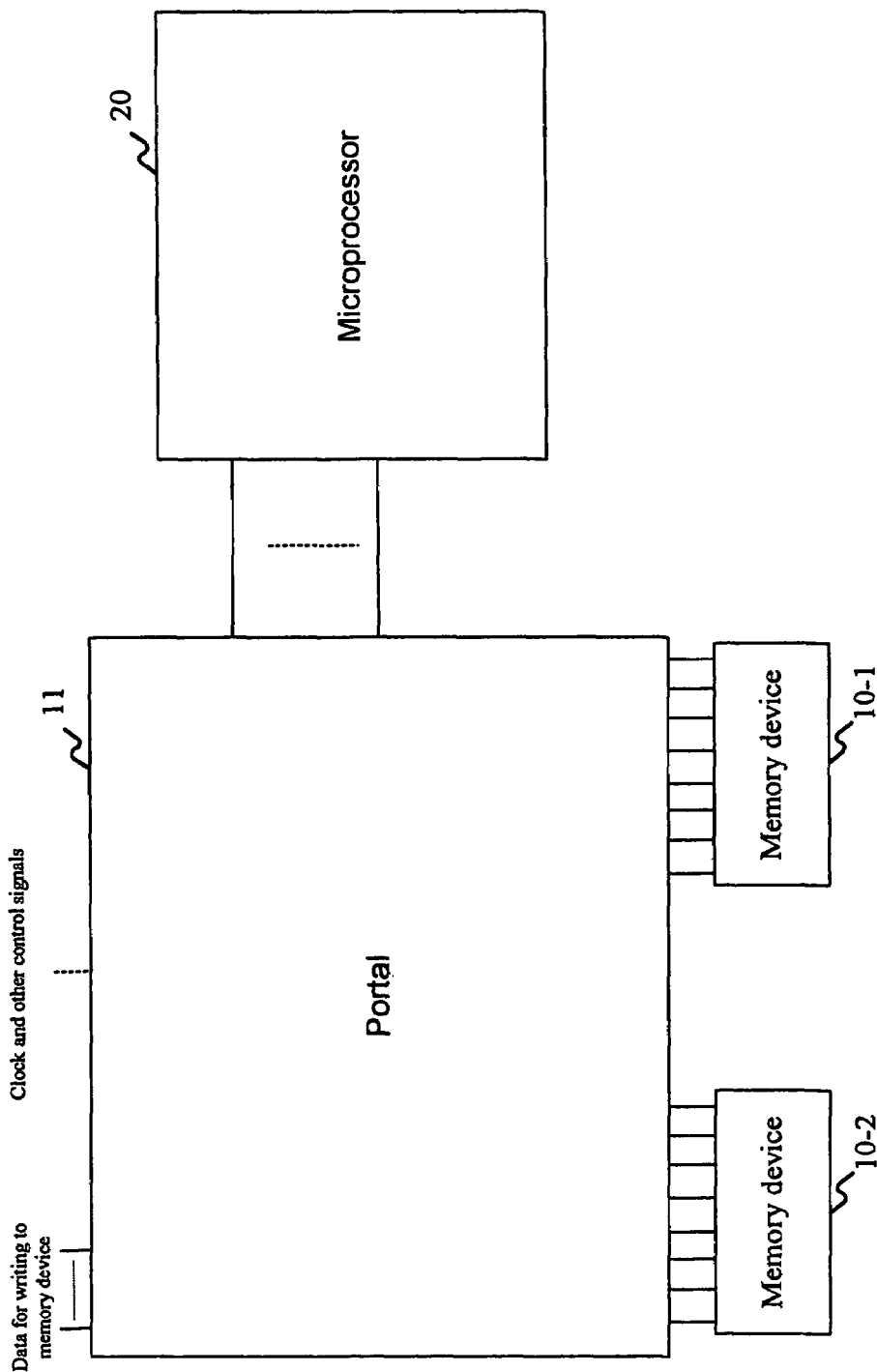
FIG. 1 illustrates a simplified diagram of a memory devices, a portal, and a microprocessor, in accordance with methods and systems provided.

FIG. 1 illustrates a simplified diagram of a memory devices 10, a portal 11, and a microprocessor 20, in accordance with methods and systems provided. The memory devices 10 may be any type of memory device, such as, Random Access Memory (RAM), Dynamic RAM (DRAM), Rambus DRAM (RDRAM), Synchronous DRAM (SDRAM), a single in-line memory module (SIMM), dual in-line memory module (DIMM), a Rambus Inline Memory Module (RIMM), magnetic memory, content addressable memory, read only memory (ROM), or any other type of memory device, in which the memory outputs may be expressed as, or transformed to, electrical data. The portal 11 will be described in more detail below. Further, for simplification reasons, no components are illustrated in the connection between the portal 11 and the microprocessor 20. However, one of skill in the art would recognize that portal 11 and the microprocessor 20 may include other components in this connection.

In the system of FIG. 1, data from the memory devices 10 preferably are, but need not be, simultaneously loaded into the portal 11 while the shift registers are continuously clocked such that the data is serially sent to the microprocessor 20. Then, data may again be loaded into the portal 11 and clocked into the microprocessor 20, and so on. The term simultaneously as used herein refers to the events occurring during one pulse of a control or clock-signal, and does not necessarily mean that the events occur at the absolute exact, same time.

Although FIG. 1 illustrates the portal 11 connected to a microprocessor 20, the portals 11 may connect to other types of devices. For example, the portal 11 may be used in a memory section such as those described in the U.S. patent application Ser. No. 10/284,199 "METHODS AND SYSTEMS FOR A STORAGE SYSTEM," by M. JAMES BULLEN, STEVEN L. DODD, DAVID J. HERBISON, and WILLIAM T. LYNCH, filed on the same day as the present application, which is expressly incorporated by reference herein in its entirety.

In addition, the portal 11 is connected to input pins 14 for writing data to the memory devices 10. In the embodiment of FIG. 1, the data for writing may be received from the microprocessor 20. In other embodiments, the data may be received from other devices.

Figure 2:
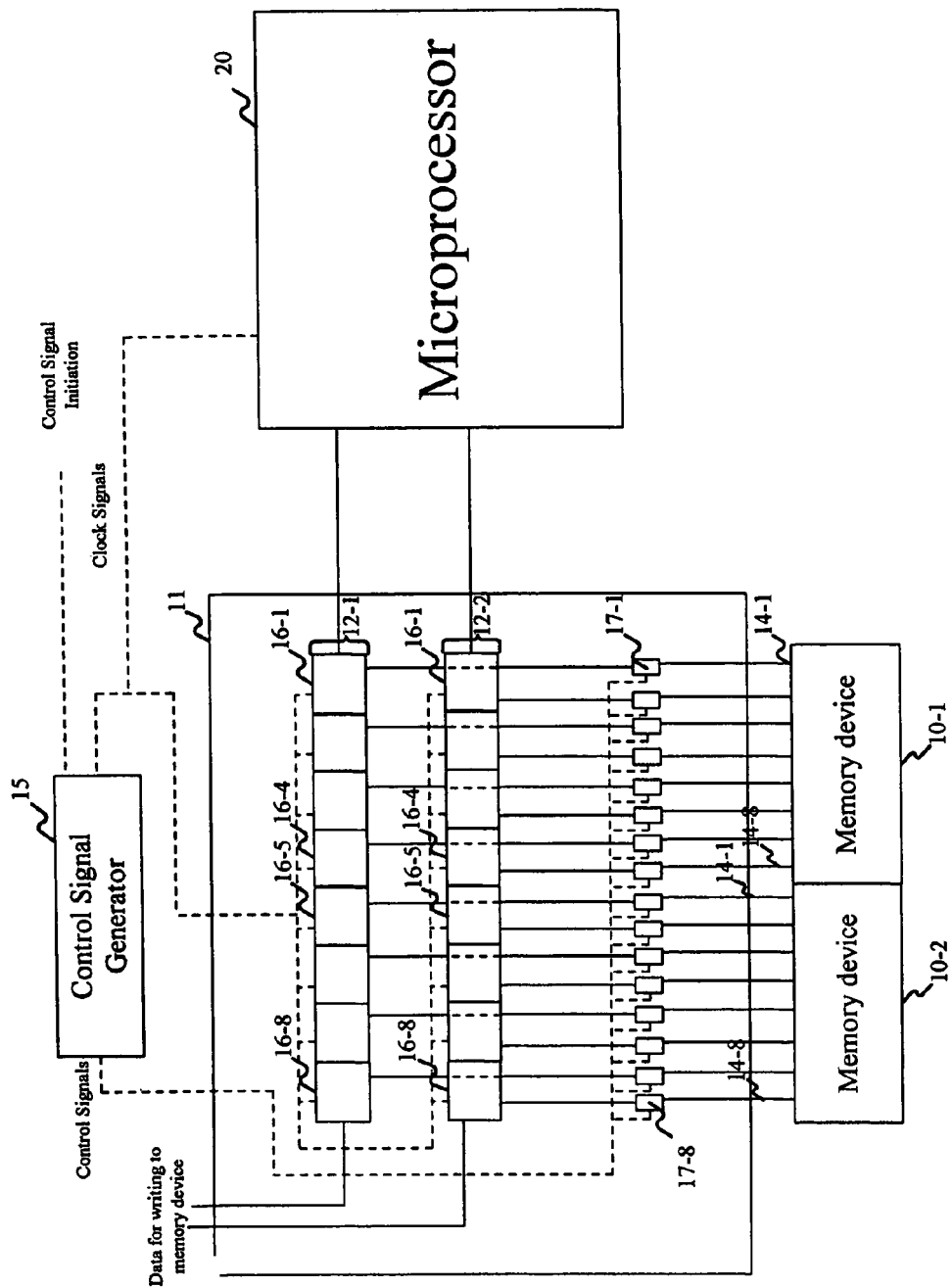
FIG. 2 illustrates a more detailed diagram of the portal and the memory devices; in accordance with methods and systems provided.

FIG. 2 illustrates a more detailed diagram of the portal 11 and the memory devices 10, in accordance with methods and systems provided. As will be obvious to one of skill in the art, this diagram has been simplified for illustrative purposes to aid in the discussion of the general operation of the portal 11.

The portal 11 includes at least one shift register chain 12 (in this example, shift register chains 12-1 and 12-2). Each shift register chain 12 includes a plurality of shift registers 16-1 through 16-*n* interconnected in series (in this case n=8). Additionally, the portal includes a plurality of connection circuits 17 for connecting the shift registers 16 with a corresponding data input/output pin 14 of a memory device 10. Also illustrated is a control signal generator 15 that provides the portal with control signals.

The shift registers 16 may be any type of shift register, whether dynamic or latching, whether single clock or master/slave clock, sampling or edge trigger, data (D), RS, or JK, or a stage of a charge coupled device (CCD), or any other type of device that shifts its input to an output on the basis of clock signal. The shift register chains 12 may include any number of shift registers without departing from the scope of the invention.

As used herein, the term "shift register" refers to any register, device, stage or anything else with one or more selectable inputs that allows a signal to be received at an input and then output on the occurrence of some event, such as, for example, a control or clock signal. Although the term shift register sometimes refers to not just a single register stage, but also, to a series of such registers, as used herein the term shift register refers to a single stage. A series of these shift registers is referred to herein as either a shift register chain or a shift register string. The series set of registers is also sometime referred to as a "series array of (shift) registers" or shift register array that may be either a single chain of shift registers or parallel chains of shift registers.

Each memory device 10 preferably includes a plurality of I/O pins 14-1 through 14-*n* (n=8 in this embodiment) for data transfer to and from the memory device 10. The memory devices 10 may include any number of pins without departing from the scope of the invention. Further, although not shown, the memory devices 10 include other pins, such as pins for receiving an address for the data to be read from or written to the memory device. A more detailed description of the shift registers 16 and the connection and the connection circuitry 17 is provided later.

In the illustration, starting at the first I/O pin (14-1), every other pin (14-1, 14-3, 14-5, and 14-7) from memory device 10-1 is connected, via connection circuit 17, to a shift register 16 in shift register chain 12-1 (shift registers 16-1 thru 16-4). And, starting at the second. I/O pin 14-2, every other pin (14-2, 14-4, 14-6, and 14-8) is connected to a shift register in shift register chain 12-2. Similarly, the I/O pins of memory device 10-2 are connected to corresponding shift registers 16 in shift register chains 12-1 and 12-2.

This figure illustrates one example of connecting I/O pins 14 of a memory device 10 to the shift registers 16 of a shift register chain 12, however, any I/O pin 14 may be connected to any of the shift registers 16 of any of the shift register chains 12. For example, rather than sequentially connecting the shift registers with the data pins, the shift registers may be connected in a pseudo random manner. For example, shift register 16-1 of shift register chain 12-1 may be connected with pin 14-6 of memory device 10-1, shift register 16-3 of shift register chain 12-2 with pin 14-4 of memory device 10-1, shift register 16-1 of shift register chain 12-1 with pin 14-7 of memory device 10-2, and so on. Such a mechanism could be employed for storing, and extracting, the information in the memory in an encrypted manner, or for other engineering considerations.

In embodiments employing encryption, the encryption may be, for example, hardwired or software (SW) may be employed to modify the selections. An encryption-scheme that can be modified both in its write mode and/or in its subsequent read mode is a preferable encryption, for which one or two "keys" associated with the time of write and/or with the time of read may be used. To accomplish such a software modification, as an example, multiple selection gates may be inserted within the wiring path that interconnects the connection circuitry 17 outputs and their transfer nodes within the shift register array, or a router switch can be inserted between the input/output pins 14-1 to 14-*n* and the corresponding input/output nodes connecting to 17-1 to 17-*n*. Software defined inputs to a router switch between the memory input/outputs and the connection circuitry input/outputs on the memory side of 17-1 to 17-*n* may be used to guarantee that each memory input/output has only one complete wiring path to a connection circuitry-input/output of 17-1 to 17-*n*, and that each connection circuitry input/output has only one complete wiring path to a memory input/output, in embodiments where this is desirable. These routing switch inputs can be modified under computer control for selected files that are either written into the memory or are read from the memory in order to be transmitted.

Additionally, although FIG. 2 illustrates an array with two shift register chains 12-1 and 12-2 and two memory devices 10-1 and 10-2, this mechanism could be employed to connect any of shift register chains 12 to any number of memory devices 10. Preferably, the number of shift registers 16 is greater than or equal to the number of bits transferred simultaneously from the memory devices 10.

For example, the portal 11 of FIG. 2 could be split into two portals 11 each connected to a single memory device 10-1 or 10-2. In such an embodiment, the first portal could include shift registers 16-1 thru 16-4 of each shift register chain 12-1 and 12-2, respectively, along with the corresponding connection circuitry 17-1 thru 17-8. Likewise, the second portal could include the shift registers 16-5 thru 16-8 of the two illustrated shift register chains 12-1 and 12-2 along with the corresponding connection circuitry 17-9 thru 17-16. Then, shift register 16-4 and 16-5 of the two chains would be serially connected such that shift register 16-5 feeds its output directly to shift register 16-4.

Additionally, although FIG. 2 illustrates the portal 11 including two shift register chains 12-1 and 12-2, the portal may include any number of shift register arrays. Further, the shift register arrays 12-1 and 12-2 may be combined in a single M×n array, where M is the number of chains of serially connected shift registers, and n is the number of shift registers in each chain. For example, in the embodiment of FIG. 2, the shift register arrays 12-1 and 12-2 may be combined into a single 2×8 array. In alternative embodiments the width and the length of the array can be any size desired by the system designer without departing from the scope of the invention. Benefits of a differing widths and lengths of the shift registers arrays is discussed in further detail later.

Although the control signal generator is illustrated as external to the portal 11, the control signal generator 15 may be included in the portal 11, or in the microprocessor 20, or the control signals may be received from some external source (not shown). The control signals, along with example embodiments of the control signal generator 15, are discussed in greater detail later.

Additionally, one or more portals 11 may be embodied oh a single chip. Further, in addition to the portal(s), 11 the chip may also include the control signal generator 15 and/or the memory devices 10. For example, with regard to the embodiment of FIG. 2, a single chip may include the portal 11, the control signal generator 15, and the memory devices 10-1 and 10-2. Such a chip would need only two input/outputs for reading-data from the memory devices 10-1 and 10-2 to the microprocessor 20 because all connections between the memory device 10 and the portal 11 would be internal to the chip. In contrast, if the memory devices 10-1 and 10-2 and the portal 11 were embodied in different chips there would be sixteen connections between the memory devices 10 and the portal 11. Thus, by including the portals 11 and memory devices 10 on the same chip the number of I/O connections necessary for retrieving the data from the memory devices may be reduced. With the Memory I/O's and the portal I/O's no longer a limitation to the design of the individual chips, wider I/O's for the memory may be employed, since all such buses are internal.

Figure 3:
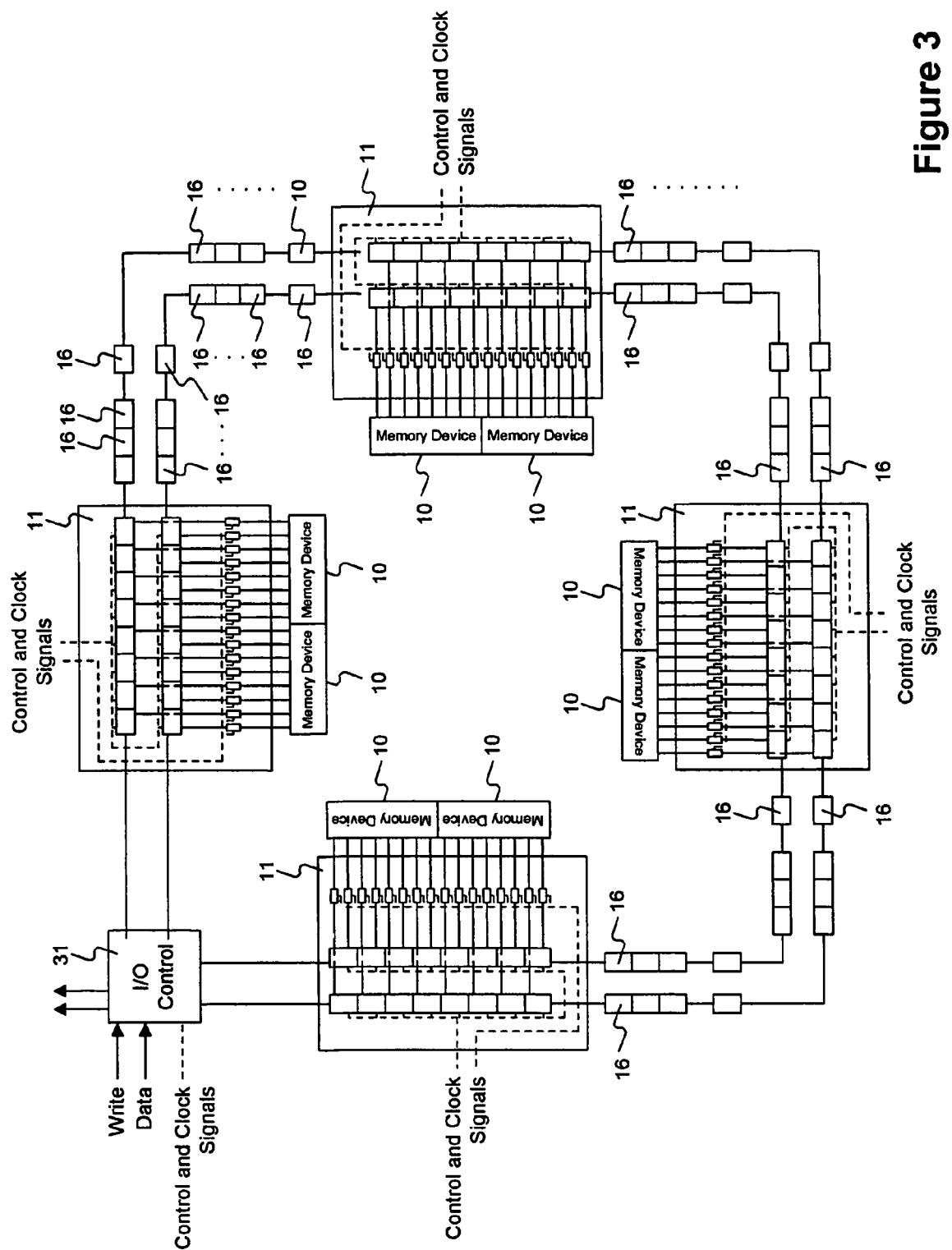
FIG. 3 illustrates a simplified diagram wherein shift register chains are connected such that they form a ring, in accordance with methods and systems provided.

FIG. 3 illustrates a simplified diagram wherein the shift register chains 12-1 and 12-2 bare connected such that they each form a ring. Such a mechanism can be used to load storage rings, such as those described in U.S. Pat. Nos. 5,604, 682; 5,636,139; 5,581,479; and 6,356,973 with data, which are each incorporated by reference in their entirety herein. For example, as illustrated, the ring of FIG. 3 includes a plurality of shift registers 16 interconnected in series to form a ring. Four portals 11 are illustrated, each connecting a plurality of the shift registers to two memory devices 10. Additionally, an Input/Output I/O) controller 31 is illustrated that is used for passing data from the ring to another device (read data), and for inserting data into the ring so that it may circulate the ring and/or be written to one or more memory devices 10. The I/O controller 31 may also receive clock and control signals from other sources (not shown) for clocking and/or controlling the ring, portals, and memory devices. One of skill in the art will understand that this is but one exemplary embodiment wherein memory devices may be used for reading to or writing information from a ring such as that described in the above-referenced patent applications, and other embodiments including any number of memory devices, shift registers, parallel rings, and I/O controller 31 may be implemented.

Figure 4:
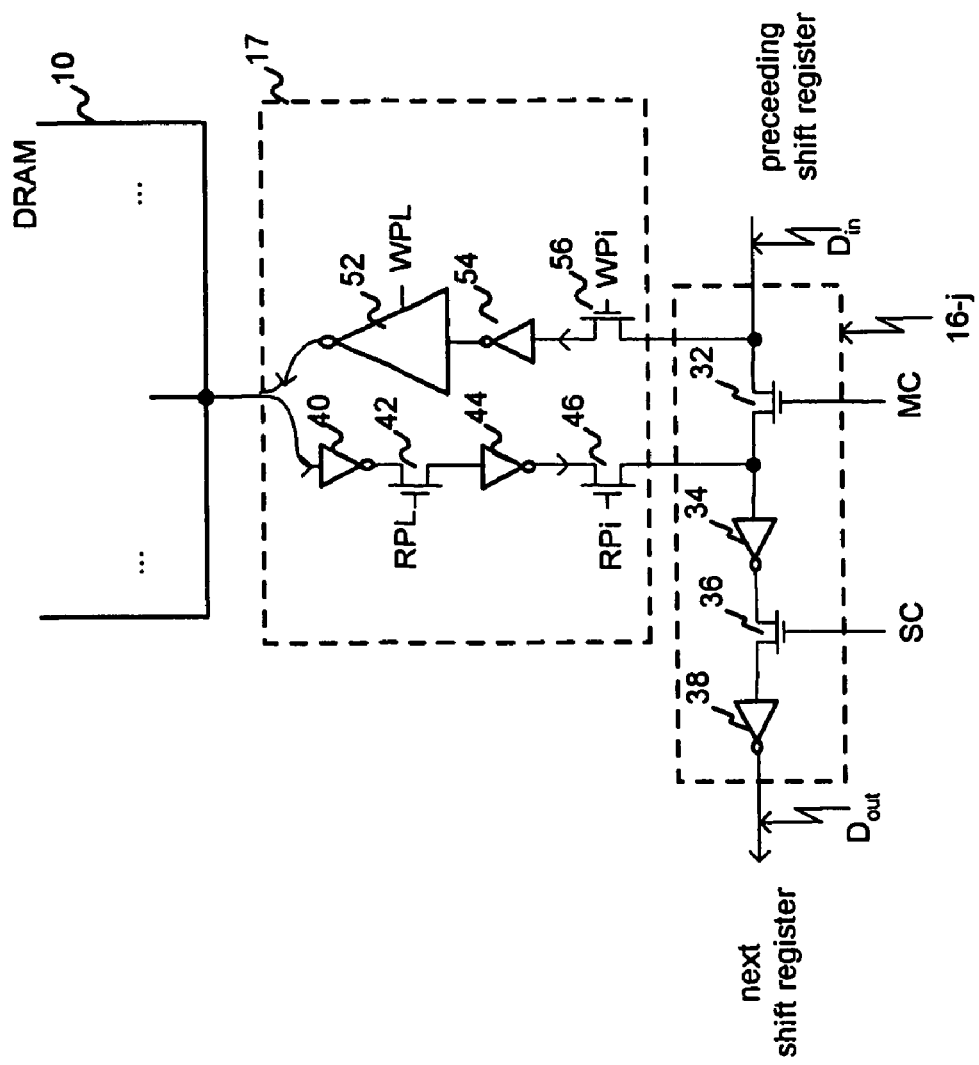
FIG. 4 provides a more detailed diagram of a connection between an I/O pin of a memory device and a shift register of a shift register chain, in accordance with methods and systems provided.

FIG. 4 provides a more detailed diagram of a connection between an I/O pin 14 of a memory device 10 and a shift register 16 of a shift register-chain 12, in accordance with methods and systems provided. More particularly, FIG. 4 illustrates a means for connecting a pin 14 of a memory device 10 to the jth shift register 16-j of a shift register chain 12, such as those illustrated in FIG. 2. Similar connections may be used for connecting every pin 14 of a memory device 10 to the corresponding shift registers 16 of the shift register chains 12.

As illustrated in FIG. 4, the shift register 16-j includes a transmission gate 32 that receives a signal from a master clock, a transmission gate 36 that receives a signal from a slave clock, and two inverters 34 and 38. Transmission gates are sometimes also referred to as "pass gates." The connection circuitry 17 includes an inverter 40, a transmission gate 42 that receives a read load signal (RPL), a transmission gate 46 that receives a read pass signal (RPi) and an inverter 44 for reading data from the memory device. The connection circuitry 17 further includes a transmission gate 56 for the initial passing of data to be written into the memory, followed by an inverter 54 to restore full signal strength, and an inverting tri-state buffer 52, which becomes an active inverter by means of a WPL control input. A tri-state buffer presents a high impedance (capacitive floating output) when it is not activated. Although FIG. 2 illustrates, and FIG. 4 assumes, the timing pulse generation circuitry 15 is external to the portal 11, this circuitry 15, as discussed above, may be included in the portal 11, or as an extended description of the connection circuitry 17.

Figure 6:
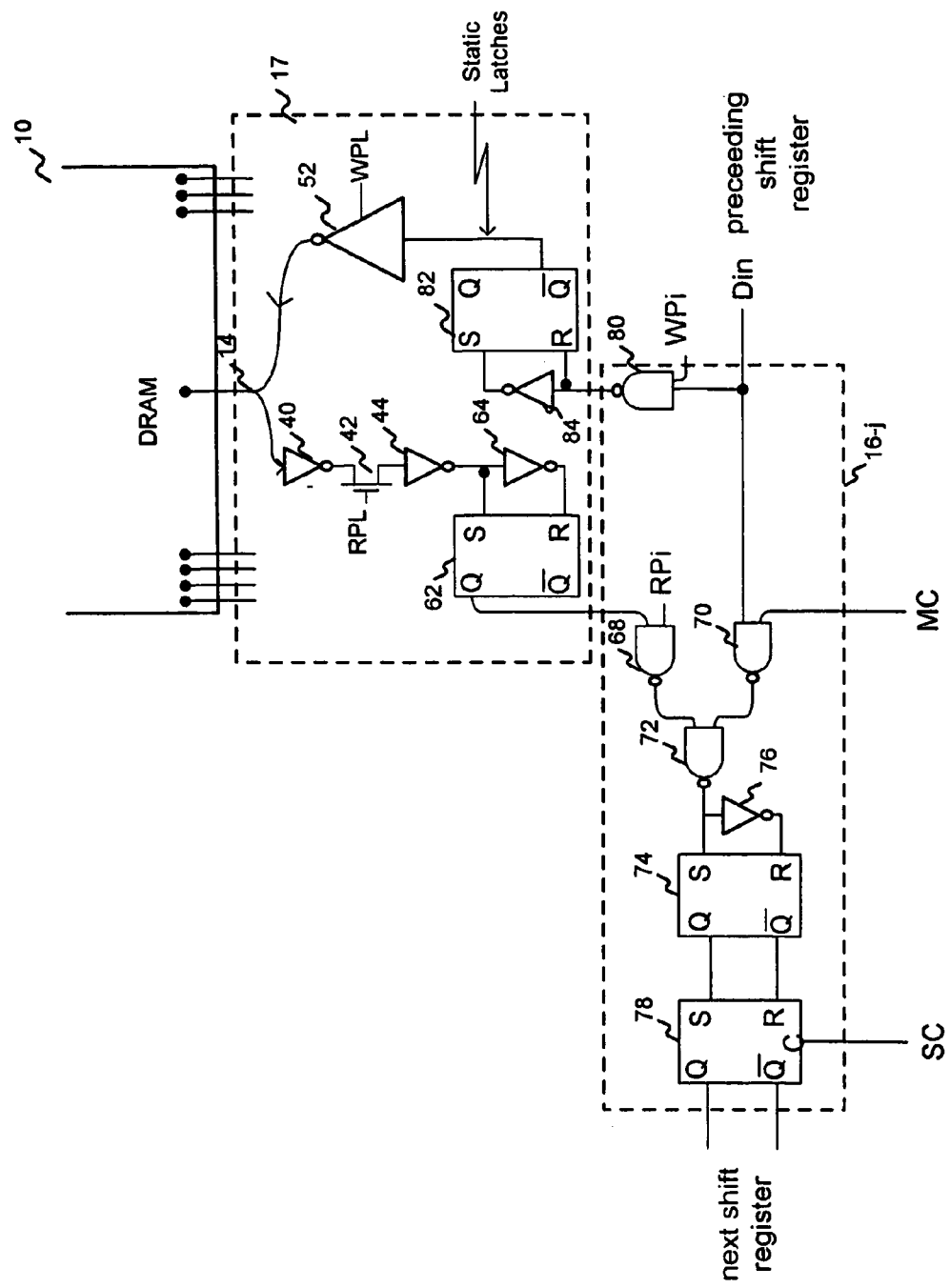
FIG. 6 illustrates an alternative mechanism for connecting shift registers with the I/O pins of a memory device, in accordance with methods and systems provided.

In FIG. 4, the shift register 16-j may be referred to as a "dynamic shift register" because it uses transmission gates (sometimes also referred to as pass gates) instead of "latches" to store the ones and zeroes within the register. FIG. 6, which will be discussed later, illustrates an embodiment in which the shift register 16-j uses latches. Dynamic shift registers must be continuously recharged, or the charge moved along, or else the charge is lost. In a "latch" mode, cross-coupled inverters provide gain and an automatic recharge that maintains the stored information as long as the power supply is maintained. The dynamic storage on the output side of the transmission gate preferably uses a follow-up inverter so that its gain provides a full level one or zero even as the dynamic charge partially trickles away.

The transmission gate 42 and the tri-state buffer 52 for reading from and writing into, respectively, the memory device 10 are preferably never simultaneously activated since preferably the system does not permit a simultaneous read and write for the same memory device 10. Since at least one of these transmission paths is preferably always open, there can be no looping back of data either from the write channel of the connection circuitry 17 to the read channel, or from the read channel of the connection circuitry 17 to the write channel. In the read channel the two transmission gates (42 and 46) and the two inverters (44 and 34) act as a full stage dynamic D-register (or dynamic shift register), with RPL playing the role of a master clock and RPi playing the role of a slave clock. Transmission gate 56 and inverter 54 represent a first half of a dynamic D-register (or dynamic shift register), with WPi playing the role of a master clock. A corresponding half stage for the slave half of the register is not necessary or desirable since the always-active inverter at its output would be "fighting" for control, of the I/O interface whenever a read output was presented by the memory. This problem corresponds to the situation within a memory with a common I/O. It can be resolved in the memory by employing a tri-state buffer for any read data that leaves the memory. In FIG. 4, the tri-state buffer 52 is inserted as the output of the write channel of 17, since the write channel of 17 is equivalent to the read channel internal to the memory.

The synchronization of RPL and WPL to the memory operation along with the flexibility of the RPi and WPi pulses will be described later. All RPi pulses (WPi) may have the same timing with respect to the RPL pulse (WPL), or all may have different timings, or each may have any variation in between. It is, however, preferable that the RPL pulse precede the RPi pulses and that the WPi pulses precede the WPL pulse, since the RPL and WPi pulses are equivalents of master clock pulses. These timing pulses can be appropriately timed with respect to the shift array's MC and SC clock pulses. This timing may be set by the hardware (HW) design or by the HW design combined with software (SW) control. The connections of gates 46 and 56 to specific register sites may also be set by HW design (as in FIG. 4) or by HW design combined with SW control.

All of the dynamic (charge storage) circuitry that has been described for FIG. 4 can be replaced by conventional "latch-register" circuitry. Dynamic registers are useful because of their reduced transistor counts. It is also immaterial whether the alternative HW configurations of control circuitry 17 invert the stored memory data. It is, however, preferable that the number of inversions be the same in the write channel as in the read channel. It is for this reason that the tri-state buffer 52 in the write channel is an inverting buffer rather than a non-inverting buffer.

Figure 5:
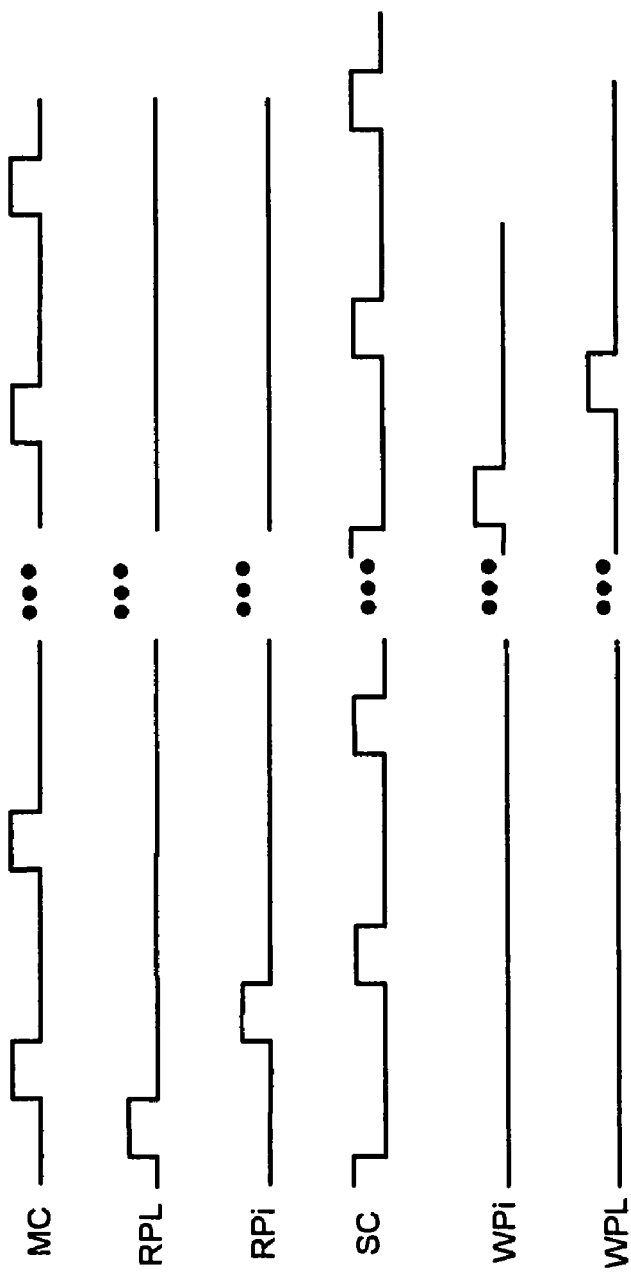
FIG. 5 illustrates clock signals, in accordance with methods and systems provided.

FIG. 5 illustrates clock signals for the connection of FIG. 4, in accordance with methods and systems provided. In particular, FIG. 5 illustrates a master clock signal (MC), a write pass signal (WPi), a write load signal (WPL), a read load signal (RPL), a read pass signal (RPi), and a slave dock signal (SC). The clock and control signals may be provided by the microprocessor, separate circuitry, or some combination of the two. For example, in FIG. 2, the microprocessor 22 provides the clock signals while separate control: signal generation circuitry 15 produces the control signals. The timing pulses in this figure assure the loading (Read or Write) operations do not interrupt the shifting operations. Write data continues to shift through the array even as it is written into the memory device 10. Read data automatically overwrites any data in the array that the array would otherwise shift through the array.

A read operation for reading data from a memory device 10 into a shift register 16 will now be described with reference to FIGS. 4 and 5. First, the memory device 10 is provided with an address for the data to be read. This address may be provided from the microprocessor or by a separate controller (not shown). The memory device 10 then latches the data to its I/O pins 14. The RPL signal is preferably timed to be at the center of the "output valid" time for the memory. This allows for any natural drifts or aging of the DRAMs, SDRAMs, or whatever other types of memory devices may be used. Having a stable output is preferable because RPL is a narrow sampling pulse. RPL transfers charge to the output side of transmission gate 42 and transfers the memory output to the output of inverter 44. Even when RPL is turned off, and even if the memory output itself changes, the originally sampled output is available at the input side of transmission gate 46.

When the master clock signal (MC) goes high, the input signal (Din) is passed through the transmission gate 32 and its inversion is presented to the input side of transmission gate 36. Generally, the Din signal is the signal being passed through the shift register 16 from the preceding shift register 16 of the shift register chain 12. Thus, when information is not being read or written to the memory device, the data may be clocked from one shift register to the next shift register in the chain by the master and slave clock signals.

In this case, however, data is being read from the memory device 10. Thus, after the master clock signal (MC) goes low, and before the slave clock (SC) goes high, the read pass signal (RPi) goes high causing the data from the memory device 10 to pass through the inverter 34 to the transmission gate 36 thus overwriting the Din data previously clocked thru the transmission gate 32. RPi is preferably a narrow sampling pulse that transfers the data stored at the node between 44 and 46 to the dynamic node between transmission gate 32 and inverter 34. The charging displaces (overwrites) any stored charge from Din and the action of MC. Inverter 34 provides the inversion of the (original) memory data to the input side of transmission gate 36. Next, the slave clock (SC) goes high and the data is passed thru inverter 38 to the next shift register 16-j+1 of the shift register chain 12. The data may then pass from each shift register 16 to the next in accordance with the master and slave clock signals until it reaches the microprocessor 20

A writing operation for writing data to the memory device 10 will now be described with reference to FIGS. 4 and 5. First, data is clocked into the shift register 16 from a previous shift register or other source via Din. In the period before MC goes high this data is held at the input to transmission gate 32. If WPi then goes high, before MC goes high, the data held at Din is passed through transmission gate 56 and its inversion resides at the node between inverter 54 and tri-state buffer 52.

The next pulse to occur is the master clock (MC) which is applied to transmission gate 32. Although the data that was stored at the input node has now been transferred to the node between 56 and 54, the data is still present at the original input node, since that node preferably continues to have its charge maintained by the output-inverter of the previous stage. The write data is, therefore, unaffected by the write operation itself, and it is transferred down the chain just as, data would be without a write or read operation. This Write data may or may not be used for future Writes downstream at other memories or for transmission elsewhere at the end of the shift register chain.

When WPL goes high, after MC has gone low, the tri-state buffer 52 is activated by WPL. Since this is an inverting buffer, the original write data at the input Din is presented to the output I/O pin 14. WPL is preferably applied at a time when the memory I/O is stable and is receptive to the input write data. Just as for RPL, the timing of WPL can be adjusted to accommodate a particular memory and can be reliably timed for both DRAMs, SRAMs, or any other type of memory device. The memory device may then write the signal to memory at an address received via the memory device's address pins (not shown). This memory address may be provided by the microprocessor or by separate control circuitry (not shown).

The four pulse sequence for Read—RPL, MC, RPi, SC—and the four pulse sequence for Write—WPi, MC, WPL, SC—effectively amount to a four-phase system in which no two adjacent transmission gates are ever "on" (closed) at the same time. The shift register array with its clocking of MC and SC continues unaffected by any Read or Write operations. Multiple MC (and SC) pulses may occur after RPL and before RPi, as long as the order is maintained. Multiple MC (and SC) pulses may also occur after WPi and before WPL.

FIG. 5 also indicates that not all RPi pulses must occur at the same time, nor must all WPi pulses occur at the same time. Later discussion will show that hardware (HW) design can provide a variety of RPi (or WPi) pulsing for a fixed application. HW design with selectors plus software (SW) controls can provide flexibility for changes in RPi (WPi) in a general manner. FIG. 4 also implies that the Read and Write channels from the memory to the shift register array are fixed by hard wiring. This is the general case, but it is also possible to employ HW design, with selectors plus SW controls that will permit variable connections from memory to shift register nodes.

FIG. 4 is not intended to imply that the shift register array consists of only one shift register chain. Multiple chains can be arranged in parallel to create a true M×n array, where M equals the number of parallel chains, n equals the number of registers in each chain (assumed to be of equal length), and the product M*n equals the total number of registers which can be simultaneously accessed via memory. For example, for a single memory with 64 output bits, a dedicated array could be 1×64 (a single chain), 2×32 (two parallel chains), 4×16, 8×8, 16×4, 32×2, or 64×1. One method for selecting M is considered in a subsequent discussion. In other embodiments, the shift register arrays may have any number of shift registers and any number of parallel chains. For example, a 2×34, a 1×65, 6×9, etc. array may be used to for accessing a single memory with 64 outputs.

FIGS. 4 and 5 present the case for a shift register array that can be used for both reading and writing, but not simultaneously, unless the write is carried out upstream in the array and the read is carried out downstream. Later discussions will present an alternative embodiment in which a write-dedicated shift register array is separate from a-read-dedicated shift register array. This permits writes to occur in one (or more) memory devices while reads are occurring simultaneously in one or more other memory devices.

FIG. 6 illustrates an alternative mechanism for connecting the shift registers 16 with the pins 14 of the memory device 10, in accordance with methods and systems provided. In this embodiment, complementary metal oxide semiconductor (CMOS) latch shift registers are used in place of transmission gates.

In particular, the connection circuitry 17 of the embodiment of FIG. 6 includes transmission gate 42, inverters 40, 44, 64, and 84, inverting tri-state buffer 52 and latch registers 62 and 82.

Further, the shift register 16 includes inverter 76, nand gates 68, 70 72, and 80 and latch shift registers 74 and 78. Nand gate 68 takes as its inputs the output from the latch shift register 62 and the read pass signal (RPi). The output of the nand gate 68 is connected to nand gate 72. Nand gate 70 provides the other input to nand gate 72. Nand gate 70 takes as its inputs the master clock signal (MC) and the signal from a preceding read/write shift register (Din). The output of nand gate 72 serves as the S input to shift register 74 and its inverse serves as the R input. The output of latch shift register 74 serves as the input to latch shift register 78. Latch shift register 78 also receives a slave clock signal (SC).

Additionally, for writing information to the memory device nand gate 80 takes as its inputs a write pass signal (WPi) and Din. The output of nand gate 80 is sent to latch register 82 of the connection circuitry 17. The inverse of the output from latch register 82 is then used as the input to the tri-state buffer 52. Because the inverse of the latch register 82 is used, there is no need for an inverter.

The reading and writing operations of the embodiment of FIG. 6 may be performed using the clocking signal illustrated in the previously described FIG. 5. The reading and writing operations of this embodiment are preferably performed in the same manner as was described with reference to FIGS. 4 and 5.

Figure 7:
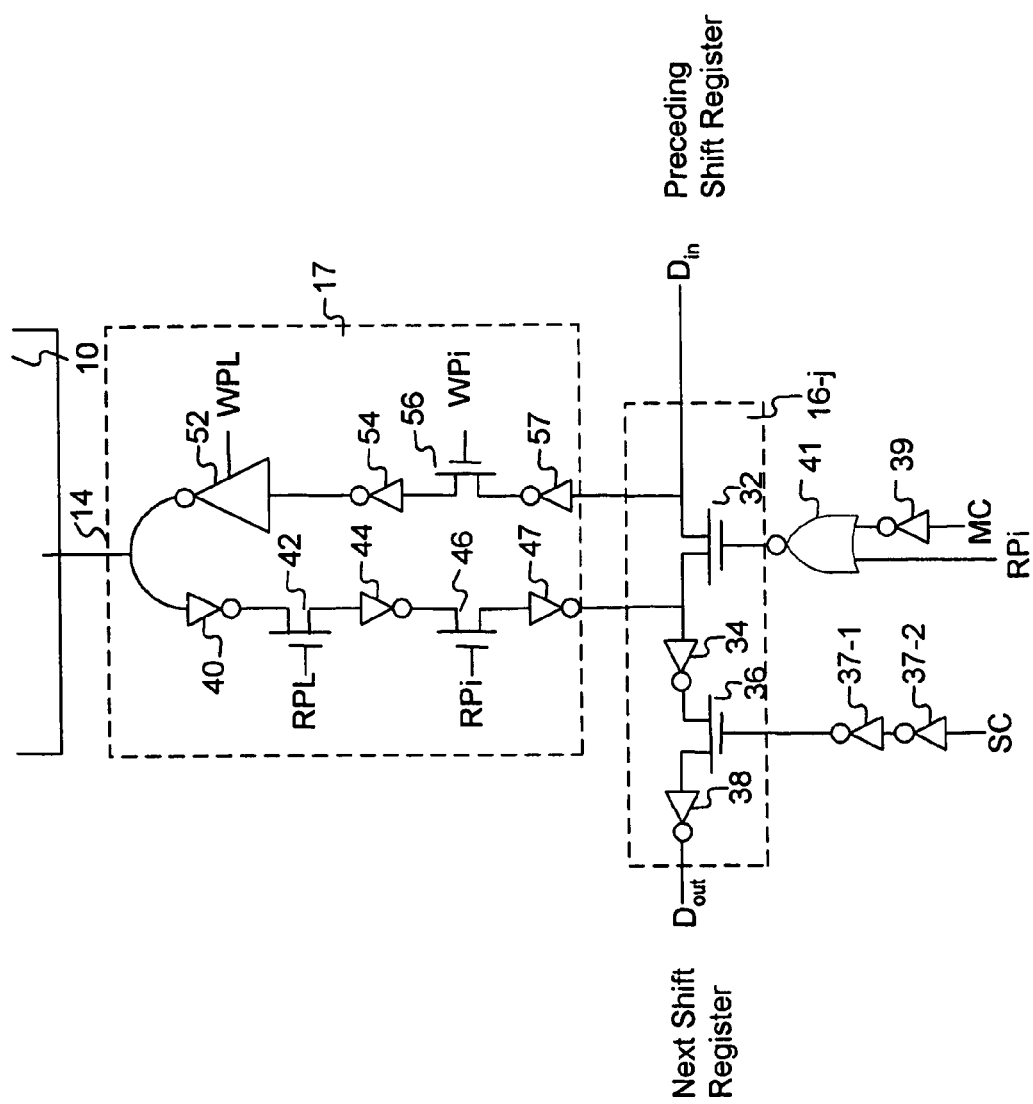
FIG. 7 illustrates a connection between an I/O pin of a memory device and a shift register of a shift register chain, in accordance with methods and systems provided.

FIG. 7 illustrates a modification to the connection between an I/O pin 14 of a memory device 10 and a shift register 16 of a shift register chain illustrated in FIG. 4, in accordance with methods and systems provided. In FIG. 7, the connection circuitry 17 is the same as that in FIG. 4, except for the two additional inverters (47 and 57) which precede transmission gates 46 and 56 in the Read and Write channels, respectively, of 17. These inverters separate the three transmission gates 46, 56, and 32 from one another. The data stored in memory 10, in this example, is the non-overlapping inverse of the actual data; however, since the number of inversions in the write channel still equals the number of inversions in the Read channel of 17 this is immaterial. Additionally, the shift register 16-j is essentially the same as that of FIG. 4. The essential difference between FIG. 4 and FIG. 7 is that FIG. 7 employs a standard 2-phase pulse scheme rather than the 4-phase scheme of FIG. 4. Data shifting in the shift register array still continues without any interruptions because of the write and read operations. RPL, when it occurs, is preferably coincident with MC; RPi, when it occurs, is preferably coincident with SC. WPi, when it occurs, is preferably coincident with MC; and WPL, when it occurs, is preferably coincident with SC.

Figure 8:
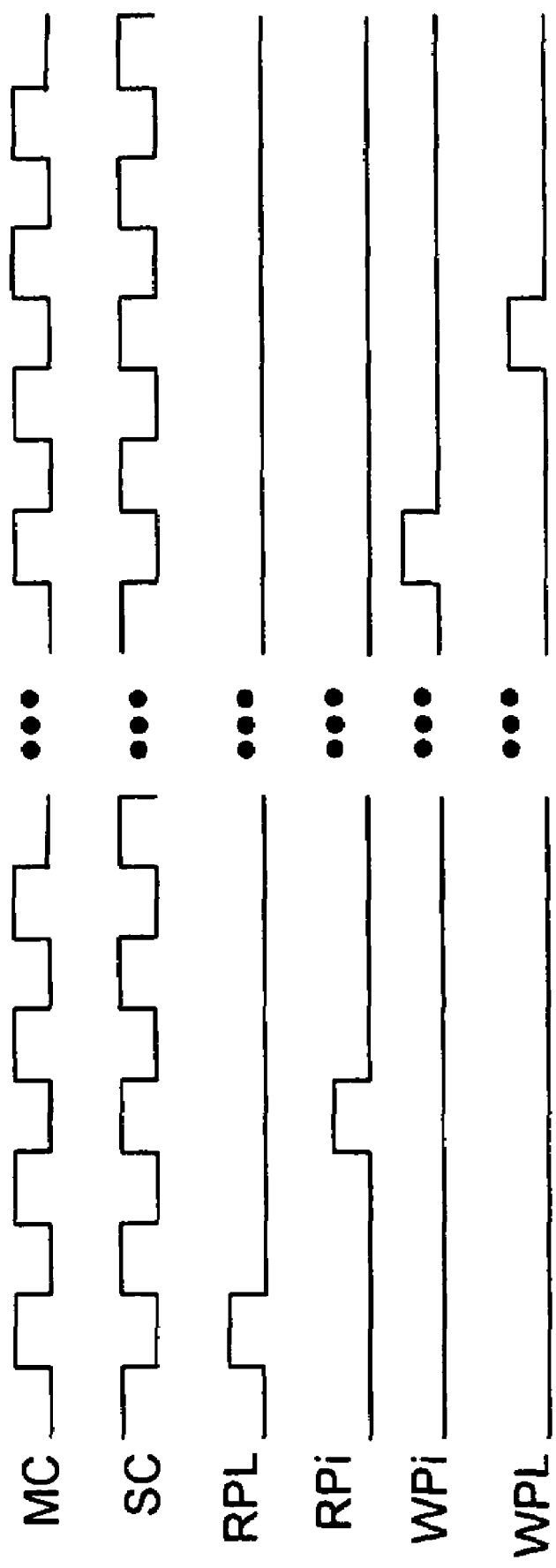
FIG. 8 illustrates clock and control signals, in accordance with methods and systems provided.

FIG. 8 illustrates clock and control signals for the connection of FIG. 7, in accordance with methods and systems provided. As illustrated, the master clock signal (MC) is a periodic signal (as in FIG. 5), and the slave clock signal (SC) is the inverse of the master clo ck signal (MC). The read load signal (RPL) is coincident with a master clock (MC) pulse. The read pass signal (RPi) occurs subsequent to the read load signal (RPL) and is coincident with a slave clock (SC) pulse. Further, the write pass signal (WPi) is coincident with a master clock (MC) pulse. The write load signal (WPL) occurs subsequent to the write pass signal (WPi), and is coincident with a slave clock pulse (SC).

In FIG. 8, the WPi pulse is considered to be correlated with the MC pulse that occurs at the same time, the WPL pulse is correlated with the SC pulse that occurs at the same time, the RPL pulse is correlated with the MC pulse that occurs at the same time, and the RPi pulse is correlated with the SC pulse that occurs at the same time. The term "correlation" means that the WPi, WPL, RPL, and RPi pulses are timed such that the data read from or written into the memory devices using the respective pulses are read or written in such a manner that the shift register maintains its shifting as if only a shift was taking place. That is, the pulses are timed such the shift register maintains its shift frequency during any reading or writing of data into or from the memory device. As an additional example, in FIG. 5, the WPL pulse is correlated with the MC pulse which follows it, the WPi pulse is correlated with the SC pulse that follows it, the RPL pulse is correlated with the MC pulse that follows it, and the RPi pulse is correlated with the SC pulse that follows it.

The reading and writing operations for the circuits of FIG. 7 correspond to those of FIG. 4 with the exception that the clock and control signals of FIG. 8 may be used for the operations of the circuitry of FIG. 7. The pulse waveforms in FIG. 8 illustrate an example where the RPi pulse is one and one half clock cycles after the RPL pulse, with RPL being coincident with MC and with RPi being coincident with SC. However, any or all RPi pulses may occur, for example, at any integer n plus one half (n+½) clock cycles after RPL, with n greater than or equal to zero. Further, in this example, the WPL pulse occurs one and one half clock periods after the WPi pulse, with WPi being coincident with MC and with WPL being coincident with SC. However, as with RPi, WPL may occur at any integer n plus one half (n+½) clock cycles after the WPi pulse; with n greater than or equal to zero.

Another difference between FIG. 7 and FIG. 4 is the insertion of Nor gate 41 and inverter 39. Nor gate 41 negates the application of a master clock pulse MC to transmission gate 32 whenever RPi is active. The disabling of transmission gate 32 does not occur during writing, and so write data continues downstream just as in FIG. 4. The write channel and the Write operation in 17 are the same as in FIG. 4 except that the WPi and WPL pulses are wider, and except for the incidental inversion of data, stored in the memory. It is the Read operation that is affected by the presence of the Nor gate, although the final outcomes are the same as for FIG. 4. In FIG. 4, the dynamic charge that is stored at the node between transmission gate 32 and inverter 34 when MC is active is overwritten when MC goes low and RPi goes high. Transmission gate 46 and inverter 44 in FIG. 4 now have complete control of this node (between 32 and 34) and overwrite the node with the Read data. If MC and RPi were both simultaneously high in FIG. 7, as may happen if the Nor gate were not employed, then inverters 44 and 30 would be fighting for control of the node. The disabling of transmission gate 32 gives the active transmission gate 46 full control of the node. The two inversions of the slave clock by means of inverters 37-1 and 37-2 may not be necessary, and merely assure non-overlaps of the MC and SC clocks, since inverter 39 and nor gate 41 require two gate delays for MC. The embodiments of FIGS. 4-8 for connecting a memory device with a shift register are but examples and one of skill in the art will recognize that other mechanisms may employed for the connection circuitry 17 and shift registers 16.

Figure 9:
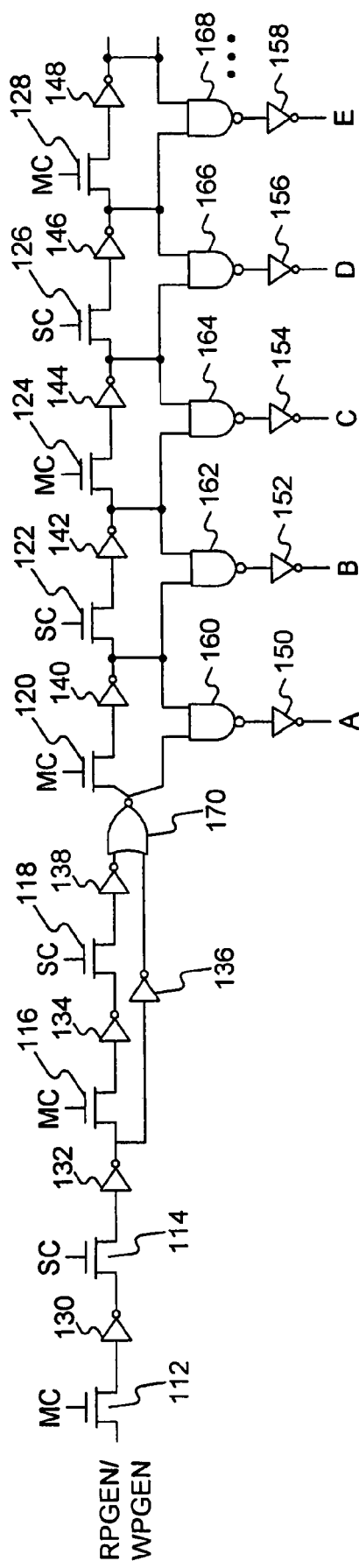
FIG. 9 illustrates a circuit for generating a read load signal (RPL) (or a Write Pass Signal (WPi)) and a read pass signal (RPi) (or a Write Load signal (WPL)), in accordance with methods and systems provided.

FIG. 9 illustrates a versatile circuit for generating a single RPL pulse along with a single or multiple RPi pulses, in accordance with methods and systems provided. This control circuit may be employed in the control signal generator 15 referenced in FIG. 2. As illustrated the circuit includes transmission gates 112, 116, 120, 124, and 128 that are clocked by the master clock (MC), and transmission gates 114, 118, 122, and 126 that are clocked by the slave clock (SC). In addition, the circuit includes inverters 130, 132, 134, 136, 138, 140, 142, 144, 146, 148, 150, 152, 154, 156, and 158. Also, the circuit includes nand gates 160, 162, 164, 166, and 168 and nor gate 170. The circuit takes as its input a read generate signal (RPGen) that goes high when portal 11 is to read data from the memory devices 10. The RPGen signal is preferably a long pulse that lasts multiple master clock-cycles consistent with the lower frequency control clocks for memories. The microprocessor 20 may generate the RPGen signal or separate control circuitry may generate this signal. In addition, the master clock (MC) may also be generated by the microprocessor 20 or separate control circuitry.

Although FIG. 9 illustrates the circuit generating five possible pulses, labeled as A, B, C, D, and E, more pulses may be generated by lengthening the shift register chain. A selector (not shown) or any other type of circuit for selecting signals may be employed for selecting among the various output pulses (A, B, C, D, or E), the RPL and RPi signals. For example, of the illustrated pulses, the RPL pulse preferably is selected from any of pulse A, C, or E. The RPi pulse preferably follows the RPL. Thus, if for example the RPL is selected as pulse A, the RPi pulse preferably is selected as B or D. Further, if for example, the C pulse is selected as the RPL pulse, then D is preferably selected for the RPi pulse.

One application of the variable timing capabilities of the RPi pulse is for synchronization adjustments between two different data streams, one of which might be resident at a distant location. An example of a synchronization adjustment is the alignment of the starting bytes in two packets of data so that they are synchronized. RPi has an adjustment range of plus or minus n/2 clock periods, and so the time at which any read data appears at the shift register outputs can be varied simply by adjusting the timing of RPi, even while RPL remains optimized in its own alignment with a stable memory output.

The following provides a brief overview of the operation of this example circuitry for generating the RPL, RPi, WPL, and WPi signals, and makes specific references to various points in the circuit labeled as point P and R. The first two transmission gates 112 and 114 and corresponding inverters 130 and 132 extending from the RPGen input to the point labeled as R preferably reshape the input pulse RPGen to guarantee synchronization in subsequent operation. The waveshape generated by the circuit at the point labeled P is preferably a positive pulse of length equal to one clock period. This pulse then moves down the register chain and produces the one half clock cycle RPL and RPi pulses at each Nand/inverter combination.

Figure 10:
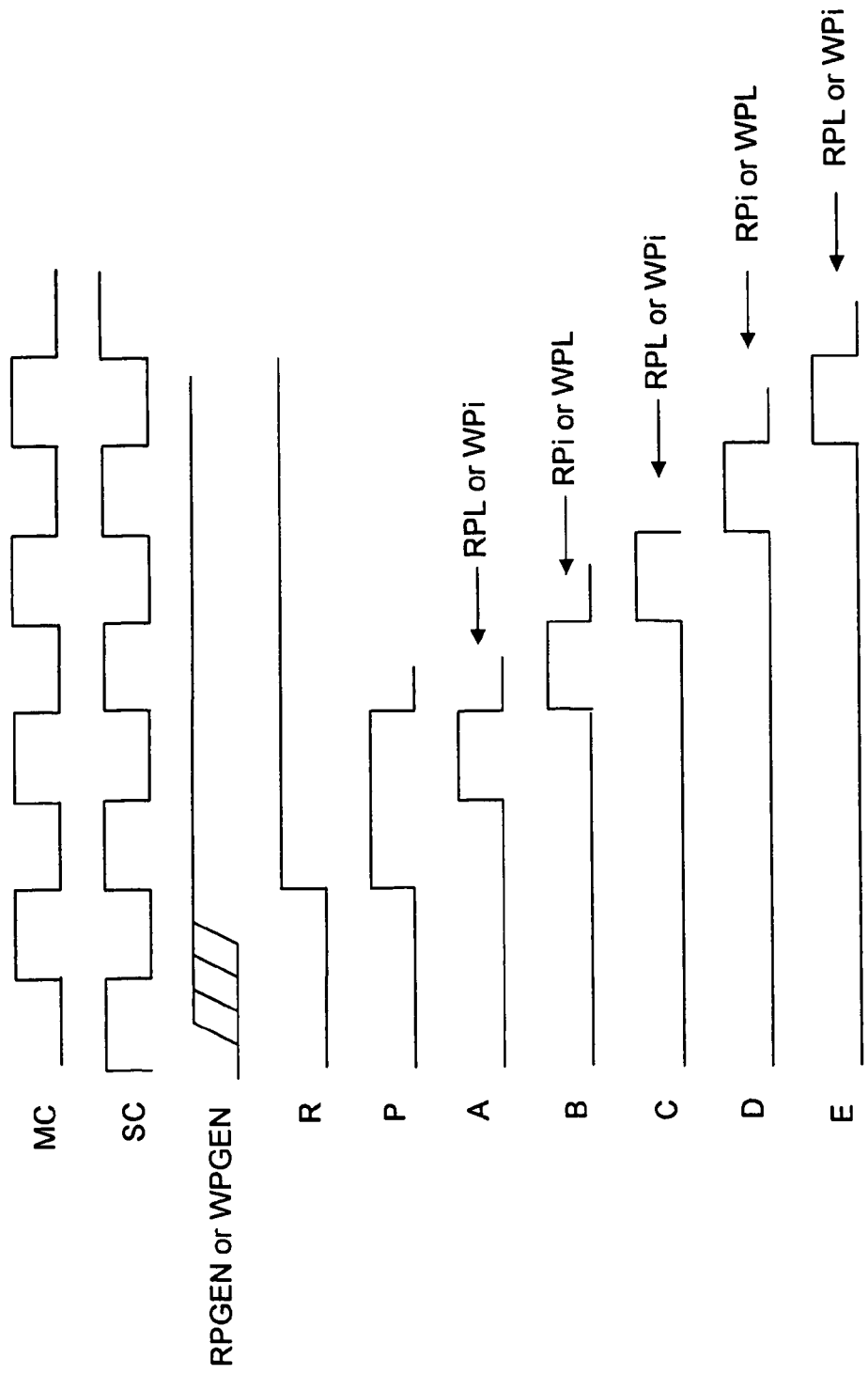
FIG. 10 illustrates signals at various points of the circuit of FIG. 9, in accordance with methods and systems provided.

FIG. 10 illustrates the signals at the points of the circuit labeled as R and P of FIG. 9 along with the pulses labeled as A, B, C, D, and E and is provided to aid in the understanding of how the circuit of FIG. 9 generates these pulses. As discussed above, the RPL and RPi signals may be selected from these pulses. As illustrated, pulse A, for example, which may be selected as the first RPL pulse, occurs coincident with an MC pulse, and is exactly one clock cycle after the capture of RPGen by a MC pulse.

With regard to the write control-signals (WPL and WPi), the circuit of FIG. 9 may be also be used to generate these signals with the exception that the input to the circuit is a write generate signal (WPGen) that goes high when it is desired to write data to the memory devices 10. Further, in such an implementation, the possible WPi pulse timings correspond with the pulse timings associated with RPL in the discussion above (A, C, E, . . . ), and the WPL timings correspond with the pulse timings associated with RPi in the discussion above (B, D, . . . ). Since there is generally only one WPL pulse and since WPi preferably occurs before WPL, a WPL choice of B leaves it with only the single choice of A as its associated WPi, a WPL choice of D leaves it with the only the two choices of A or C, etc. More choices simply require a longer shift register chain.

The circuit of FIG. 9 may be included in the microprocessor 20, may be included in the portal 11, or may be a separate control circuit associated with 17. Although this is one example of a circuit for generating the control signals, such as those illustrated in FIGS. 5 and 8, one of skill in the art would recognize that there are numerous other circuits and variations of this circuit that may be employed for generating these signals.

Figure 11:
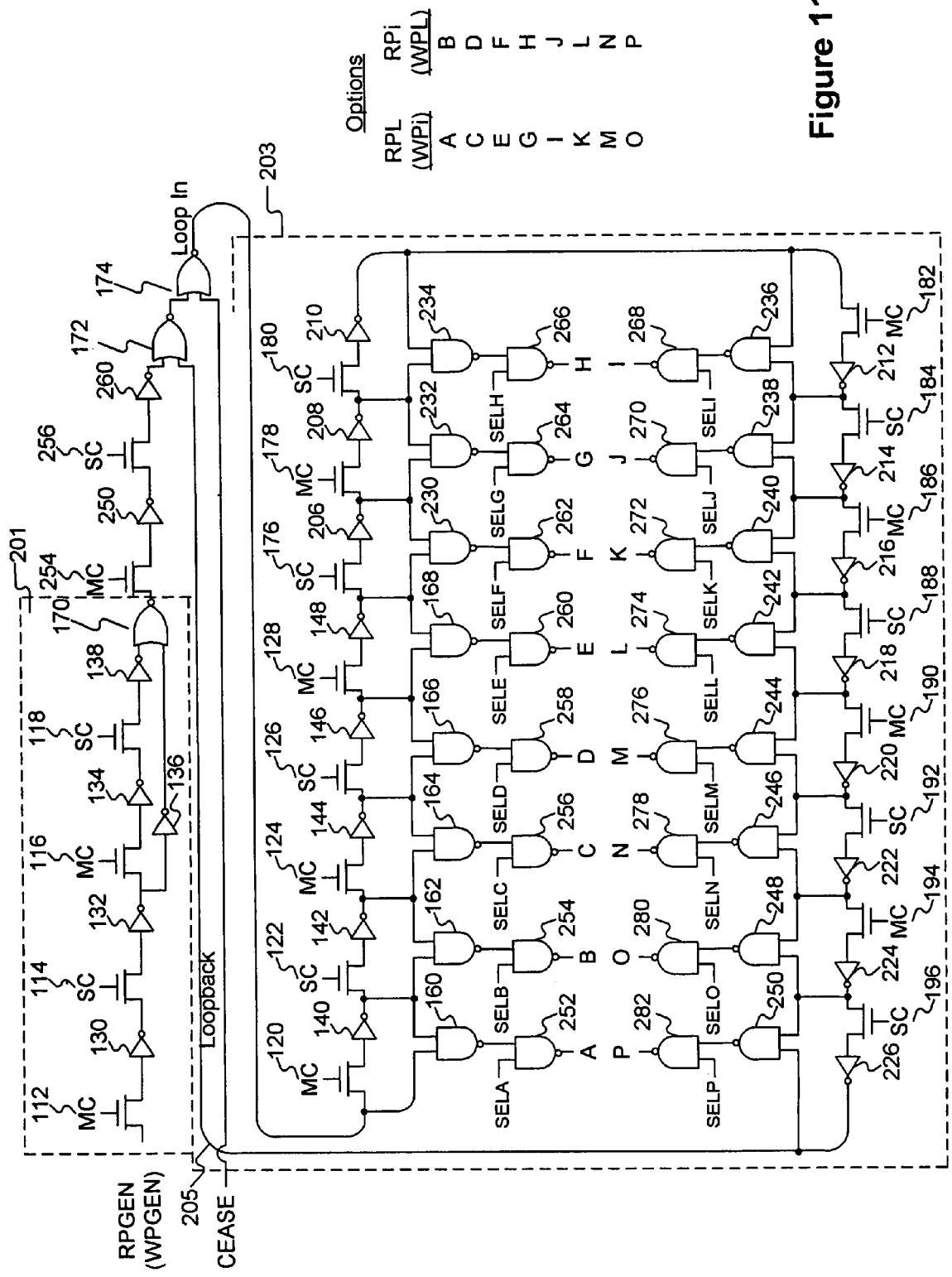
FIG. 11 illustrates a circuit that may be employed for continuous generation of RPx and WPx pulses, in accordance with methods and systems provided.

FIG. 11 illustrates one alternative example circuit that may be employed for generating RPx and WPx pulses, in accordance with methods and systems provided. This circuit could be employed in the control signal generator circuit 15 illustrated in FIG. 2. As illustrated, this circuit includes a front end portion 201 that is identical to that front end portion of the circuit of FIG. 9. The output of this front end portion 201 is then fed to a Loop 203 which in this example produces pulse signals A thru P.

In FIG. 9, RPGen (or WPGen) preferably was input to the circuit from some external source each time the memory presented a new output of data. It may, however, be desired to access the memory for many output bytes of memory in a sequential order. In the example circuit of FIG. 11, the circuit 15 may upon receiving a RPGen request pulse continuously generate new RPx (or WPx) pulses for each memory output cycle. A full period pulse is created in the same manner as in FIG. 9, but this pulse continues to loop around the circuit until a Cease signal is applied to the Loop 201. The Cease signal may be received by the circuit from some external source, such as the source supplying the RPGen signal, to indicate that the reading or writing operation may cease.

In this circuit, it is assumed that M*8 bits are loaded every 8 clock cycles from the memory device(s) 10 into the shift register chain(s) 12 and then serially clocked out of the shift registers chains prior to a new set of data being, loaded from the memory device(s) into the shift, register chains. For example, referring back to FIG. 2, there are two 8-bit parallel shift register chains 12-1 and 12-2 that are each loaded with 8 bits of data from memory devices 10-1 and 10-2. In alternative embodiments where the number of shift registers in each chain that are loaded with data from the memory device(s) is greater, the loop may be simply made longer.

The operation of the circuit corresponds to that of FIG. 9 except for the loop closure at node 205, the additional full stage shift register (comprising transmission gates 254, 256 and inverters 258 and 260) between the Nor gates 170 and 172, and the presence of the two sequential Nor gates 172 and 174. The additional shift register stage comprising transmission gates 254 and 256 produces a pipeline, interruption, without which there would be an additional delay associated with a sequence of 4 active logic gates. This shift register, although not required, provides a sharper wave shape to the full period pulse that is looping through the shift register loop. Nor gate 172 takes one input from the additional shift register and one from the LoopBack signal 205 that completes the loop. Nor gate 174 takes the input from Nor gate 172 and from the external signal Cease which stops the circulating full cycle pulse when the Cease signal is held high for a full loop cycle. The inversion of an RPGen (or WPGen) signal is a convenient way to provide the Cease signal. That is RPGen can be maintained high for the full length of time that timing pulses should be continued, and its negative-going inversion acts as a continually applied Cease signal until RPGen once again goes high.

The SelA, SelB, etc. inputs to the NAND gates 252 thru 282 preferably are activated by either HW ties to power supply buses or selected by SW inputs to select the appropriate RPX's and WPx's. Those selection choices may be determined by known properties of the related memory devices, or by calibration testing as discussed later. The ability to select and modify the timing of these pulses adds to the flexibility of this architecture design.

The following provides a general description of some of the bandwidth capabilities achievable using the above described methods and systems. The below description references a DRAM. However, similar results may be achieved with, any type of memory device.

In conventional systems, the data bits from a DRAM are read to a DRAM cache and then directly transferred onto a bus of width B for transfer to the microprocessor, where B is equal to the number of data I/O pins of the DRAM (or DRAMs if multiple DRAMs are simultaneously being used). In such, a system, the overall throughput for such a cache can never be greater than $B/t_{cycle}$, where $t_{cycle}$ is the cycle time for the DRAM. If the DRAM is not a synchronous DRAM (i.e., SDRAM), then $t_{cycle}$ could be somewhat variable depending on parameter differences among chips, aging, temperature, voltage supply variations, etc.

Each wire of a B-width bus, thus, has a holding time of $t_{cycle}$. In other words, each wire of the B width bus is operating at a frequency of $1/t_{cycle}$, and has a throughput of $1/t_{cycle}$ bits per second. Although the overall throughput, as summed over all (B) wires, may be increased by increasing B the throughput per individual wire, or the bandwidth capabilities of each wire, remains limited to $1/t_{cycle}$. A shift register array preferably allows the throughput of each output wire to equal the full limits of the combined technologies, and produces the same total throughput with a fewer number of wires.

If 2 DRAMs having 8 data I/O pins each are used in such a conventional system and $t_{cycle}$ is assumed to be 20 nanonseconds, the maximum throughput to a microprocessor would be 800 Megabits/sec (16/20 ns). However, each of the 16 buses is only operating at a frequency of $1/t_{cycle}$, which in this case would be 50 MHz.

For a system such as illustrated in FIG. 2, where 2 DRAMs of 8 bits each are connected to 2 parallel shift register chains, the master and slave clock signals shift the bits from one shift register 16 to the next. Thus, in reading the data from the memory device 10 into the shift register chain 12, the read load signal (RPL) is preferably synchronized with the $t_{cycle}$ for the DRAMs. That is, the spacing between the RPL read load signals is preferably at least equal to the longest manufacturer-guaranteed value for $t_{cycle}$ for the system environment is which it will be operating. Therefore, the frequency of the master clock signal (MC) would preferably be no more than $(B/M)/t_{cycle}$, where B is the number of I/O pins 14 of the DRAMs and M is the number of shift register chains 12, so that there are enough clock cycles to clock all the data from DRAMs out of the shift registers before the DRAMs load the shift registers with new data.

In the system of FIG. 2, B would be 16 (two eight bit DRAMs), and M would be 2 (2 parallel shift register chains). Thus, if, for example, $t_{cycle}$ is 20 nanoseconds, then the frequency of the master clock signal would preferably be no more than 400 MHz (16/2/20 ns). Further, in this system, the microprocessor is still, receiving 800 Megabits per second, but it is doing so using only 2 I/O pins of the microprocessor (each operating at a frequency of 400 MHz) as opposed to 16 I/O pins as in the above-described conventional system.

Therefore, in the system of FIG. 2, 16 bits of information from the DRAMs 10 may be supplied to the microprocessor every 20 nanoseconds. Additionally, only 2 I/O pins are used by the microprocessor to receive the data. Further, each I/O pin of the microprocessor is receiving data at a frequency of 400 MHz.

Thus, the number of necessary microprocessor I/O pins may be reduced. Or, if the number of microprocessor I/O pins is kept at 16, then 16 separate shift register chains may be used, and the value of B available to the microprocessor over that same number of leads could be increased. Further, the frequency of each shift register chain may be increased by simply increasing the number of DRAMs to which the shift register chains are connected.

For example, if there are 16 shift register chains (M=16) connected to 16. DRAMs of 8 bits each, then the master clock signal (MC) would still preferably have a frequency of 400 Mhz (16 DRAMs*8 bits each/16 shift register chains/20 nanosecond access time). However, in such a case, the microprocessor would be receiving 6.4 Gigabits/sec of data (each of its 1.6-data I/O pins would be operating at a frequency of 400 MHz).

Further, if the microprocessor desired more data per second, this could be achieved by simply increasing the number of DRAMs, which would permit the master clock signal (MC) to increase (assuming $t_{cycle}$ is 20 ns). For example, if 32 DRAMs of 8 bits each were used with 16 shift register chains, then the memory could supply the microprocessor with 12.8 Gigabits/sec of information, and the clock speed for each data I/O pin of the microprocessor could operate at 800 MHz.

The following provides a method for determining a preferable optimization relation and uses two relations for an M×n array: Maximum Memory Throughput=$C*W/t_{cycle}$=B/$t_{cycle}$; and Shift Register Throughput=$(C*W)*f_{shift}/n$=$(M*n)*(f_{shift}/n)$=$M*f_{shift}$, where C indicates the number of chips that are simultaneously accessed, W is the width of the output byte for each chip, B=C*W is the total number of bits that are simultaneously accessed, M is the number of parallel chains of shift registers, n is the number of shift registers in each chain, $f_{shift}$ is the clock frequency for operating the shift registers (i.e., shift frequency), and $t_{cycle}$ is the cycle time for accessing the memory. The following description provides one method for optimizing the system, and one of skill in the art will recognize that there are many other ways and parameters that may be used for designing the system. As such, the following description of this preferable optimization mechanism should in no way be read to limit the invention to this particular example.

In one embodiment, the two above identified relations to be equal to each other. This produces the relation C/M=$f_{shift}*t_{cycle}$/W, which will hereinafter be referred to as the optimization relation. The length of each chain, that is the number of registers in each chain is n=C*W/M. The shift register array is described as an M×n array $t_{cycle}$/W is a parameter for any particular memory, and, for purposes of this example of optimization, it can be considered as a constant, where its inverse, $W/t_{cycle}$, is the maximum possible throughput that can be achieved, no matter what the value of M or $f_{shift}$. $f_{shift}$ is assumed to have a maximum value associated with the technology of the memory device or with the transfer characteristics of the memory device's I/O transmission wires. This leaves C/M as the only remaining parameter and C and M are linearly dependent on each other. That is, if C is doubled, then the optimization relation of this example says that M must be doubled.

Preferably, the memory devices used in the above described methods and systems are synchronous. However, these methods and systems will also work with non-synchronous memory devices. For example, $t_{cycle}$ can vary significantly for non-synchronous DRAM. If the non-synchronous DRAM is not forced to be synchronous by means of external controls, the output may drift with respect to a synchronous signal for loading the shift registers with data from the DRAMs. This can result in data being read into the shift registers twice, or data not being read by the shift registers at all.

If the non-synchronous DRAM, when operating in page mode, cycles its word line addresses by means of inaccessible internal circuitry, then the memory outputs will be changing at a rate that is independent of the master clock signal (MC). With such a memory, it may not be acceptable to permit an internally controlled page mode, but rather, to cycle the input addresses by means of a controlled external address generator. If an Address Enable pulse overrides any internal page clocking, then the Address Enable timing can be continuously controlled by means of feedback. Scheduled calibration tests in which the RPL timing is incrementally changed by amounts equal to a clock period will reveal the (approximate) central time for sampling, and it is that RPL (and equivalent WPL) pulse that is selected for future pulses. Circuits such as FIGS. 9 and 11 can employ SW control to select new timing for RPL (and WPL). Additionally, internal modifications to DRAMs may be made to improve the operation of this system.

Figure 12:
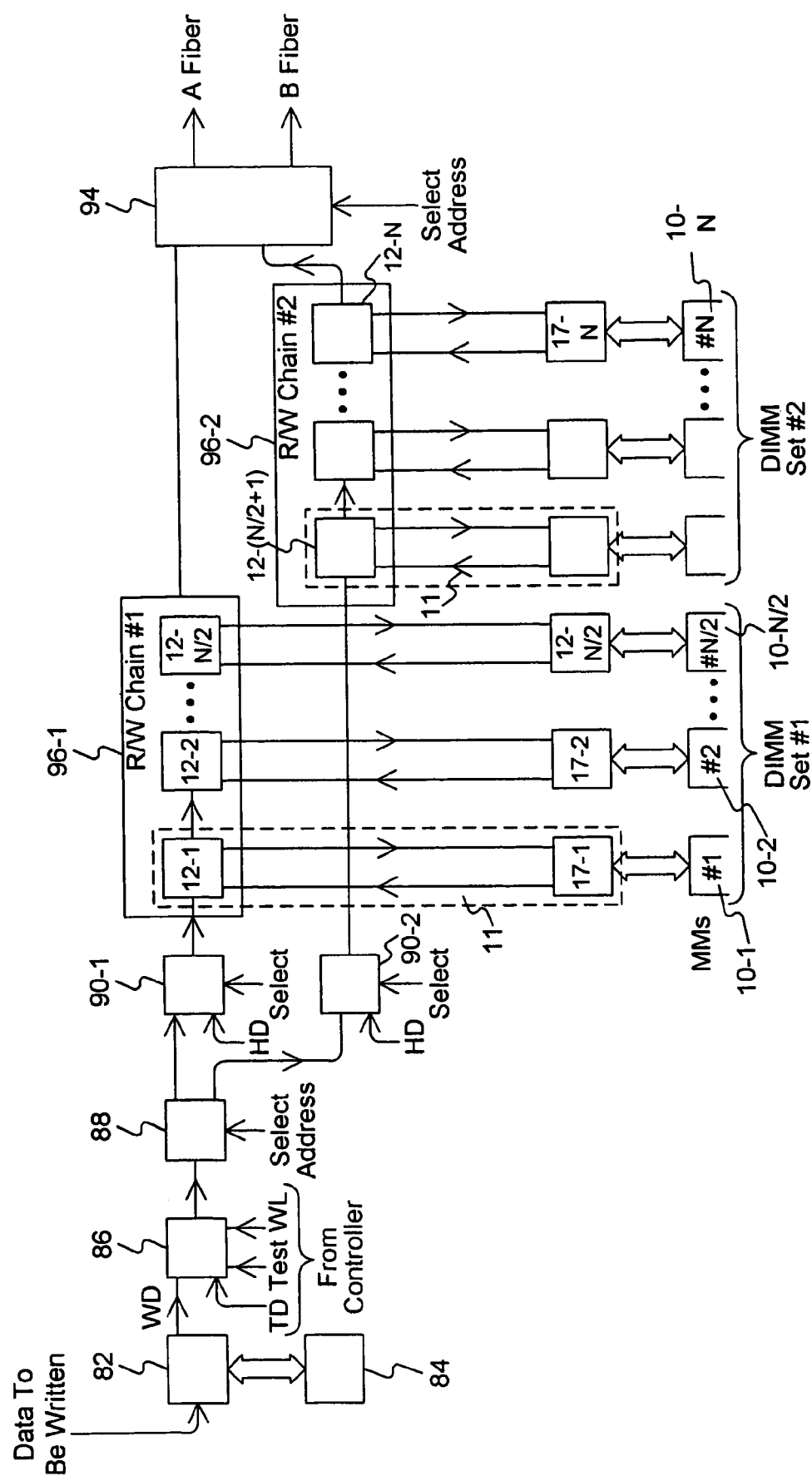
FIG. 12 illustrates an embodiment, wherein multiple portals are connected to form a chain, in accordance with methods and systems provided.

FIG. 12 illustrates an embodiment wherein the shift register chains 12 of multiple portals 11 are serially connected to form a longer chain of shift registers, in accordance with methods and systems provided. In this example, each portal 11 connects to a single memory device 10, as opposed to the example illustrated in FIG. 2 where the portal 11 connects to two memory devices 10-1 and 10-2. The portals 11, however, may include any number of shift register chains 12 connected to any number of memory devices 10. In order to improve the understanding of the following discussion the shift register chains 12 of each portal 11 will be referred to as shift register arrays 12 and the longer shift register chains comprised of the portals 11 shift register arrays 12 interconnected in series will be referred to as shift register chains 96-1 and 96-2. Additionally, although FIG. 12 illustrates the memory devices 10 being DIMMs, as discussed above, the memory devices 10 may be any type of memory device.

FIG. 12 further illustrates N memory devices wherein the first N/2 memory devices 10 are connected to a first read/write chain of shift register arrays 96-1 and the next N/2 memory device 10 are connected to a second read/write chain of shift register chains 96-2.

Further, in this exemplary embodiment, each portal 11 includes one Read/Write shift register array 12 and associated connection circuitry 17, and each memory device 10 is connected to the shift register array 12 of the corresponding portal 11 via the connection circuitry 17. Although it is not indicated in the figure, each portal 11 may also contain the RPGen and WPGen pulse generation circuitry. The portal 11 may also be referred to as a data portal (D-portal) 11 or a memory interface device. Each shift register array 12 preferably includes a plurality of shift registers 16 (not shown in this figure) in an M×n array interconnected in series with other arrays. Accordingly, the longer read/write shift register chains 96-1 and 96-2 may also be viewed as M×((N/2)n) arrays, where M is the number of parallel chains (which in this case is 2), N/2 is the number of serially connected shift register arrays 12, and n is the length of each of the shift register arrays 12. When only one memory. 10 is being read, however, the concatenated M×((N/2)n) array will, in normal operation, function as a M*n shift register array, with all upstream shifted data being overwritten by the active M*n shift register array, and all downstream data having been shifted out before the new Read data arrives.

The shift register array 12 of each portal 11 in the chain 96 are connected to the next shift register array 12 in the chain 96-1, such that the shift register arrays 12-1 thru 12-(N/2) are serially connected to form the longer chain 96-1. For example, for the chain 96-1, the shift register array 12-1 is connected to the shift register array 12-2, which is in turn connected to the next shift register array 12-3 and so on to form the longer read/write chain 96-1. Therefore, as data is clocked out of the shift register array 12-1, it is clocked into the shift register array 12-2. Read data can thus be clocked through the chain of shift registers and output from the last shift register array e.g., 12-N/2, or 12-N) to, for example, a microprocessor. In this implementation of FIG. 12, however, the data is clocked out of the shift registers to a selector 94 which switches the data to one of a plurality of optional output ports from the embodiments described in FIGS. 12-14. For example, in the example embodiments of FIGS. 12-14, the output ports are fiber optic cables (A or B) In other examples, these output ports may be routing channels, switching fabrics, or any other appropriate component desired by the system designer. The selector 94 is controlled by separate select addresses that determine the routing.

The architecture indicated in FIG. 12, with a concatenation of D-Portals that produces a longer net chain for each of the m shift register chains, introduces some limitations and adds some operating flexibility. If each D-Portal 11 has been optimized in relation to its associated memory 10, it will have particular hardware values for $f_{shift}$, M, and n. M will be the "optimum" M, the M that maximizes throughput per line when all other parameters are fixed. This is the design choice made when most accesses will be for a single memory 10 at one time. If a neighboring memory 10 and its associated concatenated D-portal 11 are simultaneously accessed, then each D-Portal 11 must wait for 2*n clock shifts before, it is able to read new information into its shift register array without the occurrence of undesired overwrites somewhere in the concatenated shift register array. The throughput for each wire is unaffected, and, therefore, the overall throughput for two memories is the same as for one, but the cycle times for each memory must be doubled. For some applications or other engineering considerations, however, it may still be desirable to have the flexibility to access two memories and to interleave their outputs in a single data stream. An optimization that favors the access of only a single memory at a time is acceptable and desirable when the I/O traffic is limited by its own number of ports, which are two in the example of FIG. 12. It is, however, possible to access all N/2 memory devices 10 simultaneously if there is a desire to multiplex, i.e., interleave, the output bytes W from each memory device 10. Using the same notation as was used earlier, C now becomes equal to N/2, and n becomes equal to n*N/2. If M, which is fixed for the case of FIG. 12, had been chosen to optimize the throughput rate for C=1, then the new throughput rate is still equal to $M*f_{shift}$. (The optimization relation would have increased M by C and would have increased the throughput by C.) This flexibility for multiplexing output bytes from different DIMMs can, e.g., be used for comparing data bases from two files. If the system will permit, and desires, such multiple memory device 10 (e.g. DIMM) addressing with multiplex interleaving, then the RPL and RPi timing loop must be longer for each portal and the timing selections must be adjusted whenever multiple simultaneous Reads are requested. The loop in FIG. 11 would-now be (W/M)*N/2=n*(N/2) clock cycles long for each pulse generation circuit in each portal in order to accommodate the longest time period when all memory devices might be interleaved. There would be one RPL selected within the loop for each D-Portal for C=N/2, and N/2 RPL's selected for C=1. N/2 Cease input locations may be used to shut down the loop faster than with a single Cease input.)

In addition, FIG. 12 illustrates a write temporary portal (T-portal) 82, a temporary storage memory device 84, a test selector 86, a switch router 88, and selectors 90-1 and 90-2. These components are included in this exemplary embodiment and may or may not be included in different embodiments. The write temporary portal 82, also referred to as a T-Portal, is preferably a shift register array such as described above, which incorporates all of the elements of the D-Portal 11. The temporary store memory device 84 may be any type of memory device, such as a DRAM, SDRAM, SIMM, DIMM, etc. The selectors 86, 90-1, 90-2, and 94 may be any type of selector for selecting among a plurality of input signals. The write switch 88 may be any type of switch or routing selector for sending input traffic from one port to any one of a plurality of ports.

The read/write connection circuitry 17 preferably includes circuitry such as that described with reference to FIGS. 4 thru 8. Additionally, although not shown, control and clock signals may be provided to the embodiment of FIG. 12 using circuitry such as that described above to provide a master clock (MC), slave clock (SC), read load signal (RPL), read pass signal (RPi), Write load signal (WPL), and write pass signal (WPi). For example, the circuitry described with reference to FIGS. 9 thru 11, may be used for generating the control signals. The memory devices 10 may be any type of memory device, as discussed above, such as, for example, DRAMs, SDRAMs, SIMMs, DIMMs, etc.

A writing operation for the embodiment of FIG. 12 will now be described. Data to be written to the memory devices 10 first arrives at the Write T-Portal 82. This T-Portal 82 is much like a D-Portal 11, in that it contains a shift register array, control circuitry, and control pulse generation circuitry. This data may be provided via a fiber optic cable, or other high throughput wiring, and under the control of separate control circuitry (not shown).

If the memory device 10 to which the data is to be written is busy, or even if it is not, the data may be written to the temporary memory device 84, where it is held until the memory device 10 is ready to receive the write data. When the memory device 10 is ready to receive the write data, the data is passed to the test selector 86, which, because this is a writing operation, is set to pass the Write Data WD to the write switch (router) 88. The write switch 88 receives a select signal that switches the write-switch 88 so the data is sent to the appropriate chain of shift registers 96 associated with the memory device 10. The write data is then clocked into the chain of shift registers where it is clocked through until it is loaded into the shift register array 12 corresponding to the memory device 10 to which the data is to be written. The data is then written to the memory in a manner such as that described above with reference to FIGS. 4-8.

A reading operation for the embodiment of FIG. 12 will now be described. First, header data, such as, for example, a destination address, is supplied to the appropriate read selector 90-1 or 90-2. The destination address is an address that any switches between the embodiment of FIG. 12 and the destination to which the data is to be sent could use to switch the data so that it is sent to the appropriate address. For example, if the destination is a computer connected to the Internet the destination address could be an IP address. Alternatively, the destination address could simply be an internal address that switches in a storage hub may use, such as the storage hub described in the above-referenced U.S. patent application "METHODS-AND SYSTEMS FOR A STORAGE SYSTEM," by M. JAMES BULLEN, STEVEN L. DODD, DAVID. J. HERBISON, and WILLIAM T. LYNCH filed on the same day as the present application.

In implementations where data other than, or in addition-to, the previous "destination-related" data is coming from sources other than the memory devices, such as, for example, from a cached disk array (CDA) system, then this data can be serially loaded into the array using the selectors 90-1 and/or 90-2 and simply forwarded, e.g., to a microprocessor. If the system is intended only for straightforward communications with, for example, a microprocessor, and no serial inputs are expected, the read selectors 90-1 and 90-2 need not be used. The data is then clocked into the appropriate chain of shift registers and clocked through the shift registers.

Next, the data is loaded from the memory devices 10 in the chain into, the corresponding shift register chains 12 in the chain such that the header data HD (e.g., a destination address) is appended to the front of the chain.

The data is then serially clocked through and out of the chain of shift registers 96 and passed to the selector 94. The selector 94 receives a control signal directing the selector 94 to send the data via one of the fiber optic cables. The selector 94 then switches the data to the appropriate fiber optic cable. In other implementations, such as that illustrated in FIG. 1 where the portals 11 send the data directly to a microprocessor, the selector 94 need not be included . . .

A test operation for the embodiment of FIG. 12 will now be described. In certain instances, it may be desirable to test the system using known data. When testing the system, a Test select signal is sent to the write/test selector 86 that directs the selector to begin sending test data to the write switch 88, which is then passed through the system. The test selector 86 may receive the test data via an input pin from the controller (not shown), another device, a memory device, or some other type of storage media (not shown). A second select lead permits a set of 0's (Clear Data) to be input to the shift register array in place of either Write Data or Test Data. The Clear data resets the register to a known state for initialization.

This test data could also be written into the memory devices 10, and later read out, in order to test the entire operation. Such an input is very useful for programmed-self tests that test the availability and quality of the system. The write data may be written into any one, or all, of the memory devices 10 in either Read/Write chain 96-1 or 96-2.

Figure 13:
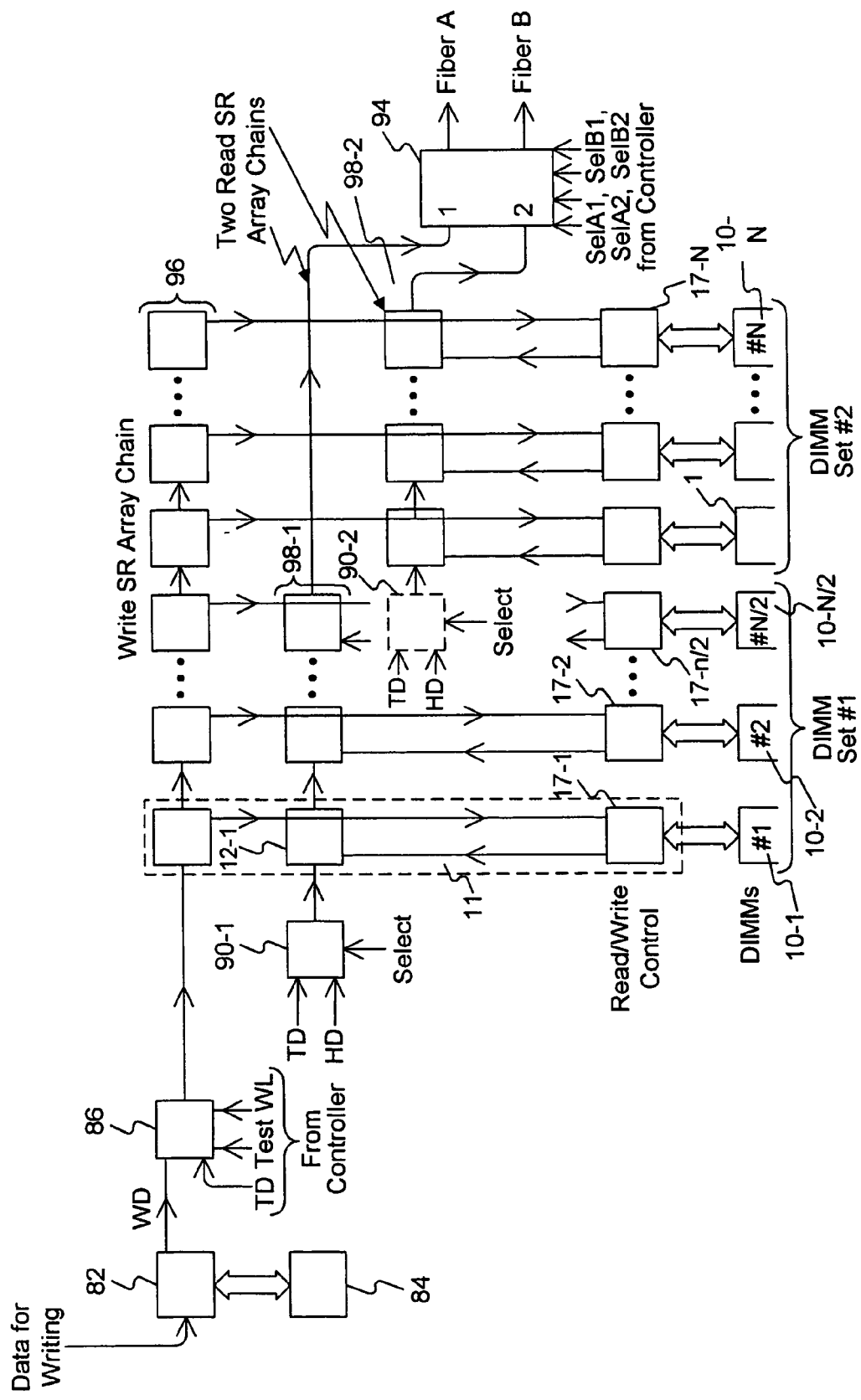
FIG. 13 illustrates an embodiment that uses separate shift registers arrays for reading from the memory devices and writing to the memory devices, in accordance with methods and systems provided.

FIG. 13 illustrates an embodiment that uses separate shift register chains for reading from the memory device 10 and separate shift register chains 96 for writing to the memory devices 10, in accordance with methods and systems provided. As illustrated, the embodiment includes a write temporary portal (T-portal) 82, a temporary storage memory device 84, a test selector 86, read selectors 90-1 and 90-2, a chain of shift register arrays for writing data 96, one or more chains of shift registers arrays for reading data 98-1 and 98-2, read/write control circuitry 17, memory devices 10, and a read selector 94. Although it is not shown, each portal may also preferably include its RPGen and WPGen pulse generation circuitry.

The single write chain of arrays is useful when write operations are less common that read operations. Preferably, only one memory device 10 will be written at a time. Several memory devices 10 can be written at one time if the same data is to be written into those several memory devices and the memory device addressing is properly timed. This is one of the features of the designs in FIGS. 4, 6, and 7, since the written data is not destroyed during the write operation, but continues down the array(s) as regular shifted data. The division of the Read/Write array(s) into Read-only and Write-only arrays allows a write to take place into any memory device 10 that is not currently being read. This permits reading to have priority, and writing to have many opportunities to carry out its writes. For example, if memory device 10-1 is being read, memory device 10-2 cannot also be read, in this example, (unless outputs are multiplexed and the RPx pulses modified), but memory device 10-2 can be written.

A writing operation for the embodiment of FIG. 13 will now be explained. Data to be written to the memory devices 10 first arrives at the write temporary storage 82. If a memory device to which the data is to be written is busy, or even if its not, the data may be written to the temporary storage memory device 84, where it is held until the memory device 10 is ready to write data.

When the memory device 10 is ready to receive the data, the data is passed to the test selector 86, which because this is a writing operation, is set to pass the write data to the chain of write shift register chains 96. The data is then clocked through the shift register chains 96 until it is loaded into the write shift register array corresponding to the memory device 10 to which the data is to be written. The data is then written to the memory in a manner such as that described above with reference to FIGS. 4-8. A controller or controllers (not shown), would, supply the memory device with the address to which the data is to be written along with other control signals, such as for example WPGen, master and slave clock signals, etc. to ensure that the data is written in the proper memory device 10 at the proper location.

Next a read operation for the embodiment of FIG. 12 will be described. First, header data (HD) (e.g., a destination address) is provided to the read selector 90 for the chain that is to be read. The header data is then clocked through the chain of arrays 98 and output to the selector 94. The read data is then synchronously loaded from the memory devices 10 in the chain into the corresponding shift register array 12. The data is then clocked through the chain of shift registers 96 and passed to the read selector 94 such that the header data is appended to the front of the serialized data. The read selector 94 receives a control signal and in accordance with this signal directs the header data and read data to the appropriate output of the selector 94. The data is then sent from the selector via one of the fiber optic cables its destination. In implementations, such as that illustrated in FIG. 1, where the data is fed to a microprocessor, the read chain selector 96 need not be included.

As in the embodiment of FIG. 12, the test selector 86 may be used to feed test data to memory devices for testing the system. Test Data may also be supplied in place of, or following, destination data to 90-1 or 90-2 for testing the system. Such an operation is useful for testing the routing to specific destinations and the acceptance of pseudo data by the destination.

Figure 14:
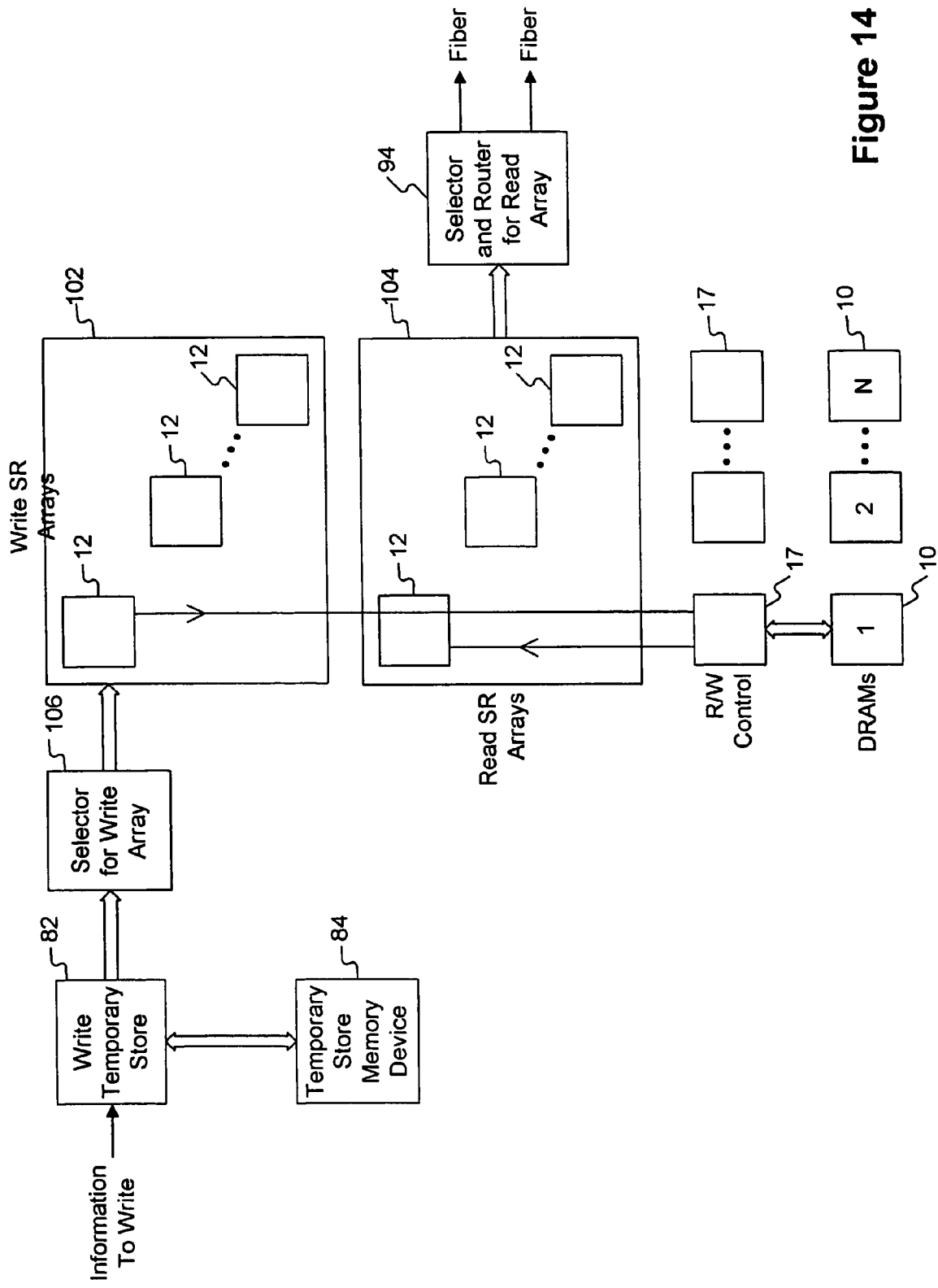
FIG. 14 illustrates a top level diagram of an embodiment employing multiple chains of write shift register chains and multiple chains of read shift register chains, in accordance with methods and systems provided.

FIG. 14 illustrates a top level diagram of an embodiment employing multiple chains of write shift register arrays 102 and multiple chains of read shift register arrays 104, in accordance with methods and systems provided. Additionally, this embodiment includes a write selector 106 that functions similar to the write selector 88 of FIG. 12. More particularly, the write selector 106 receives a control signal causing the write selector 106 to switch the data to the appropriate chain of write shift register arrays. As in the above embodiments, a controller or controllers (not shown) supply signals to these various devices to determine which memory device 10 the data is written to or read from, and the address from which to read or write the data in the memory device 10, and all other control and clock signals required by the specific implementation. It is also easily possible to incorporate means by which any two adjacent D-Portals can be connected together in series. With more selector circuitry, it is possible to join any two D-Portals together in series. This can be done to, for example, multiplex data from two files, to compare two files, and to carry out special mathematical operations (such as convolution integrals) on two files. It can aid searches within large data bases-regarding medical scans, fingerprints, security checking, etc.

The embodiments of FIGS. 12-13 may be employed in the data portals (D-portals) used in the embodiments described in the above-referenced U.S. patent application "METHODS AND SYSTEMS FOR A STORAGE SYSTEM," by M. JAMES BULLEN, STEVEN L. DODD, DAVID J. HERBISON, and WILLIAM T. LYNCH. More particularly, in FIG. 12, the combination of the read/write control circuitry 17 and the read/write shift register chain 12 corresponding to a memory device 10 (e.g., read/write control circuitry 17-1 and read/write shift register chain 12-1 corresponding to memory device 10-1) could be employed as the D-portals. Or, as in FIG. 13, the combination of the read/write control circuitry 17, the write shift register chain 12 of the write chain 96, and the shift register array 12 of the read chain 98 corresponding to a memory device 10 may be employed as the D-portals (e.g. write shift register array 12-1 of write chain 96, read shift register array 12-1 of read chain 98-1, read/write control circuitry 17-1 corresponding to memory device 10-1). Likewise, in FIG. 14, the combination of the read/write control circuitry 17, the corresponding write shift register array 12, and the corresponding read shift register array 12 corresponding to a memory device 10 may be employed as the D-portals.

Figure 15:
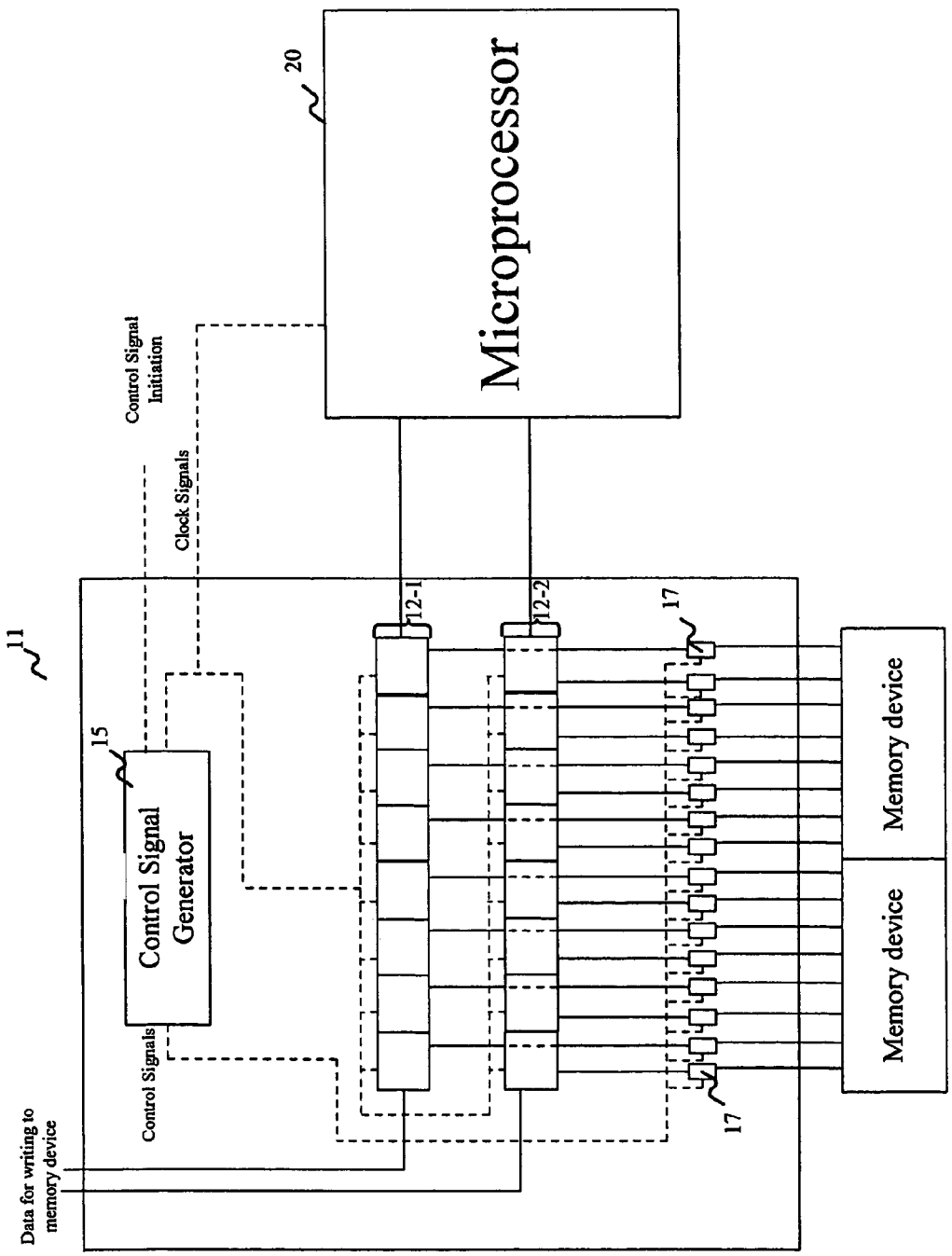
FIG. 15 illustrates an embodiment wherein the portal includes the control signal generator, in accordance with methods and systems provided.

As previously discussed, the portal 11 illustrated in FIG. 2 may also include the control signal generator 15. FIG. 15 illustrates an alternative embodiment to that illustrated in FIG. 2, wherein the portal 11 includes the control signal generator 15. This portal 11 of FIGS. 2 and 15 may be embodied on a single chip. The portal 11 may incorporate either joint Read/Write or independent Read and Write arrays as in FIGS. 12-14.

Figure 16:
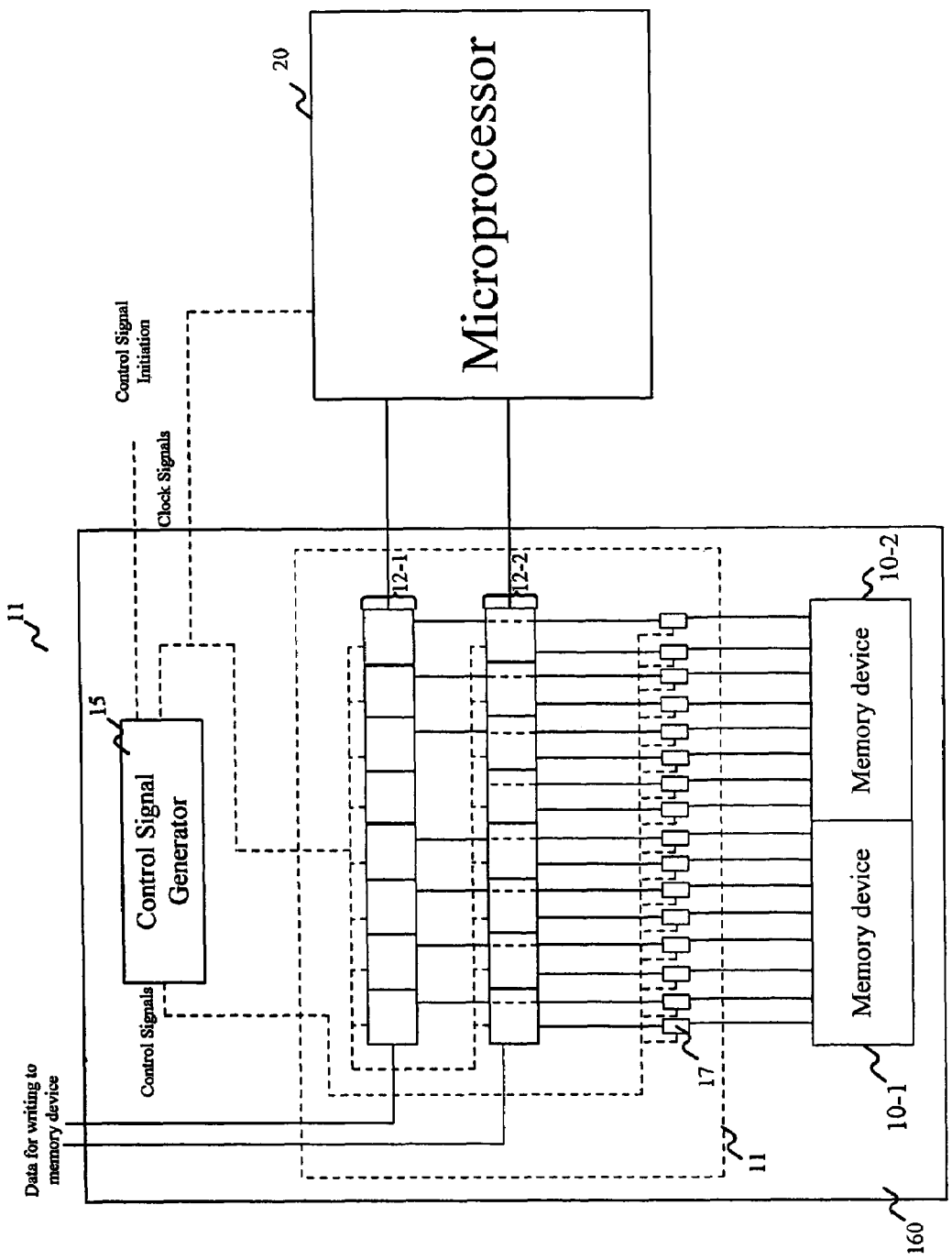
FIG. 16 illustrates an embodiment wherein a single chip includes the memory devices, the portal, and the control signal generator, in accordance with methods and systems provided.

FIG. 16 illustrates another alternative wherein a single chip 160 includes one or more memory devices 10, the portal 11, and the control signal generator 15, in accordance with methods and systems provided. In this example, the connections between the memory devices 10 and the portal 11 are internal to the chip 160. As such, the chip 160 need only have two (M) I/O pins for reading data from the memory devices 10, as opposed to the example embodiment wherein the portal 11 and memory devices 10-1 and 10-2 are each separate chips. In the example using separate chips, 16 (B=C*W=M*n) pins are used for connecting the portal 11 and the memory devices 10, and an additional two (M) I/O pins are used for transferring the read data from the portal 11. Thus, by including the memory, devices 10 on the same chip as the portal 11, the number of I/O pins may be reduced. This may be advantageous in certain instances such as, for example, the acceptance of this design by memory manufacturers and customers as a preferred alternative to having two chips at a higher price. Memory output widths will not be limited by I/O pin counts since the memory output of B bits will be internal to the chip. The customer application will be able to accommodate very wide data buses within its chip since its number of Input ports will be reduced from B to M. The multiplexed inputs on the M leads are perfectly synchronized and can be demultiplexed into B wires with the aid of a clock signal from chip 160.

While it has been illustrated and described what is at present considered to be the preferred embodiment and methods of the present invention, it will be understood by those skilled in the art that various changes and modifications may be made, and equivalents may be substituted for elements thereof without departing from the true scope of the invention.

In addition, many modifications may be made to adapt a particular element, technique or, implementation to the teachings of the present invention without departing from the central scope of the invention. Therefore, it is intended that this invention not be limited to the particular embodiment and methods disclosed herein, but that the invention includes all embodiments falling within the scope of the appended claims.

What is claimed is:

1. An apparatus, comprising:
   a data input/output port of a memory device;
   a connection circuit, connected to the input/output port of the memory device to receive data from the input/output port of the memory device and store a copy of the data; and
   a shift register that shifts according to a shift clock signal, connected to the connection circuit;
   wherein the connection circuit loads the copy of the data from the input/output port into the shift register after shift data is loaded into the shift register and before the shift data is shifted out of the shift register, such that the shift register shifts out the copy of the data from the input/output port without interruption according to the shift clock signal.

2. The apparatus of claim 1, wherein the connection circuit loads the copy of the data according to a signal derived from the shift clock signal.

3. The apparatus of claim 1, wherein the shift register is part of a shift register chain.

4. The apparatus of claim 1, further comprising:
   a transmission bus, wherein an output of the shift register is connected to the transmission bus.

5. The apparatus of claim 4, wherein the transmission bus is connected to one of a group comprising: a processor, a selector, a fiber optic connector, a routing channel, and a switching fabric.

6. An apparatus, comprising:
   a data input/output port of a memory device;
   a connection circuit, connected to the input/output port of the memory device to transfer shifted-in data to the input/output port of the memory device; and
   a shift register that shifts according to a shift clock signal, connected to the connection circuit;
   wherein the connection circuit loads a copy of the shifted-in data from the shift register to the input/output port before the shifted-in data is shifted out of the shift register, such that the shift register shifts without interruption according to the shift clock signal.

7. The apparatus of claim 6, wherein the connection circuit loads the copy of the shifted-in data according to a signal derived from the shift clock signal.

8. The apparatus of claim 6, wherein the shift register is part of a shift register chain.

9. The apparatus of claim 6, further comprising:
   a transmission bus, wherein an output of the shift register is connected to the transmission bus.

10. The apparatus of claim 9, wherein the transmission bus is connected to one of a group comprising: a processor, a selector, a fiber optic connector, a routing channel, and a switching fabric.

* * * * *